United States Patent [19]

Hsing et al.

[11] Patent Number: 6,167,025
[45] Date of Patent: Dec. 26, 2000

[54] METHODS AND APPARATUS FOR RESTORING CONNECTIONS IN AN ATM NETWORK

[75] Inventors: Deh-phone K. Hsing, Basking Ridge; Tsong-Ho Wu, Marlboro; Latha Kant, Morris Township, Morris County, all of N.J.; Bo-Chao Cheng, Weston, Fla.; Yusuf Goksel Goncu, Piscataway, N.J.

[73] Assignee: Telcordia Technologies, Inc., Morristown, N.J.

[21] Appl. No.: 08/926,255

[22] Filed: Sep. 5, 1997

Related U.S. Application Data

[60] Provisional application No. 60/025,316, Sep. 11, 1996.

[51] Int. Cl.$^7$ .................................................. G01R 31/08
[52] U.S. Cl. .......................................... 370/216; 370/217
[58] Field of Search .................................... 370/216, 217, 370/218, 219, 221, 224, 389, 392, 395, 413

[56] References Cited

U.S. PATENT DOCUMENTS

| 4,884,263 | 11/1989 | Endo et al. | 370/225 |
| 5,590,118 | 12/1996 | Nederlof | 370/218 |
| 5,764,624 | 6/1998 | Endo et al. | 370/218 |

OTHER PUBLICATIONS

"Fast Restoration of ATM Networks", Jon Anderson, Bharat T. Doshi, Subrahmanyam Dravida and P. Harshavardhana IEEE Journel on Selected Areas in Communications, vol. 12, No. 1, Jan. 1994, pp. 128–138.

"Self–Healing ATM Network Techniques Util.izing Virtual Paths", R. Kawamura, K. Sato, and I. Tokizawa, Fifth International Network Planning Symposium, Network Planning for an Open Era, Kobe, Japan, May 17–22, 1992, pp. 129–134.

"Broadband Integrated Services Digital Network (B–ISDN), Signalling System No. 7 B–ISDN User Part (B–ISUP), Formats and Codfes, Q.2763", International Telecommunication Union, Telecommunication Standardiszation Sector, Study Period 1993–1996.

"Private Network–Network Interface, Specification Version 1.0 (PNNI 1.0)", The ATM Forum, Technical Committee, Mar. 1996.

"Distributed Control Algorithm for Dynamic Restoration in DCS Mesh Networks, Performance Comparison",Bellcore Technical Memorandum, TM–NWT–021979, Dec. 1992.

A Restoration Methodology Based on Preplanned Source Routing in ATM Networks, D–P K. Hsing, B–C Cheng, G. Goncu, L. Kant, Bellcore paper.

*Primary Examiner*—Huy D. Vu
*Assistant Examiner*—Alexander Boakye
*Attorney, Agent, or Firm*—Joseph Giordano

[57] ABSTRACT

Methods and apparatus for detecting faults and restoring connections in networks including, e.g., ATM networks are described. The restoration methods of the present invention can be applied on an application by application or user by user basis. In accordance with the present invention virtual connections affected by link or node failures are restored through re-routing as opposed to establishing a completely new connection between a source and a destination device. VPI/VCI values are assigned at the time of re-routing thereby avoiding the potential problem of VPI/VCI exhaustion which may be encountered when backup VPI/VCI values are assigned at the time a communication session is initiated. The connection restoration process of the present invention is initiated by a node on the source side of a connection detecting a failure and initiating a re-routing operation or transmitting a message to the source switch to initiate a re-routing operation. A node on the destination device side of a failed connection is used for initiating the release of network resources reserved at the switches which were used as part of the no longer used path of the re-routed call. The destination device side node (switch) detecting a fault transmits a re-route release message to downstream switches. Restoration methods applicable to pre-planned hop-by-hop, pre-planned source routing and dynamic source routing embodiments are described. In one embodiment, ATM assured mode data transport operation on signaling channels is used to detect node and/or link failures.

32 Claims, 19 Drawing Sheets

| ROUTING TABLE FOR SWITCH 110 | | | |
|---|---|---|---|
| SOURCE IDENTIFIER | DESTINATION IDENTIFIER | PRIMARY PATH | ALTERNATE PATH(S) |
| DEVICE 102 | DEVICE 104 | S118 | S112; S120 |

FIG. 3A

| ROUTING TABLE FOR SWITCH 118 | | | |
|---|---|---|---|
| SOURCE IDENTIFIER | DESTINATION IDENTIFIER | PRIMARY PATH | ALTERNATE PATH(S) |
| DEVICE 102 | DEVICE 104 | S116 | S120 |

FIG. 3B

| ROUTING TABLE FOR SWITCH 110 | | | |
|---|---|---|---|
| SOURCE IDENTIFIER | DESTINATION IDENTIFIER | PRIMARY PATH | ALTERNATE PATH(S) |
| DEVICE 102 | DEVICE 104 | S118, S116, S122 | S112, S114, S122 |
| | | | S118, S120, S126, S124, S122; |

FIG. 3C

METHODS AND APPARATUS FOR RESTORING CONNECTIONS IN AN ATM NETWORK

RELATED APPLICATIONS

The present invention is a continuation-in-part of pending U.S. provisional patent application Ser. No. 60/025,316 filed Sep. 11, 1996 which is hereby expressly incorporated by reference.

FIELD OF THE INVENTION

The present invention relates to communications networks and, more particularly, to methods and apparatus for restoring connections in networks including, e.g., networks which support asynchronous transfer mode (ATM) operation.

BACKGROUND OF THE INVENTION

The size and number of networks, both public and private, used to transfer various types of digital information continues to increase. This increase reflects, in part, an increase in the number and types of applications which utilize digital information. Examples of various types of applications that involve the transfer of digital data over a network include voice telephone calls, data transmission applications such as internet access applications, and video on demand services.

In order to provide a relatively large degree of flexibility in the types of applications and services that can be supported, many digital networks rely on the use of relatively small fixed size packets sometimes referred to as cells to transfer data between nodes of a network, e.g., source and destination nodes. Data packets can be used to transmit data representing numerous types of information, including, e.g., voice data, video data, computer information, etc.

To facilitate the communication of packets and cells between networks and within networks various signaling and network protocols have been developed. The International Telecommunication Union (ITU) has published a standard setting forth various signaling protocols, formats, and codes, to be used when transmitting data in accordance with what has become known as Broadband Integrated Services Digital Network (B-ISDN). One publication describing the B-ISDN standard published by the ITU is document No. Q.2763 titled "Final Draft, Broadband Integrated Services Digital Network" (B-ISDN), Signaling System No. 7 B-ISDN User Part (B-ISUP), (9/1994). Various attempts to further define a networking standard beyond the B-ISDN standard have been made by The ATM Forum a group dedicated to developing a standard for asynchronous transfer mode (ATM) communication in networks. The ATM Forum has published a specification titled "Private Network-Network Interface Specification Version 1.0" (PNNI 1.0) (March 1996).

Asynchronous transfer mode (ATM) is one known method of communicating data using fixed size packets, i.e.., 53 byte cells, in a network. Networks which use ATM for communicating information are generally referred to as ATM networks. While the present invention will generally be described in the discussion that follows in the exemplary context of an ATM network, it is to be understood that the invention is not limited to such an embodiment but may be used in a wide variety of network connection restoration applications.

ATM networks normally include a plurality of interconnected nodes. The individual node connectivities in a network form a plurality of potential physical paths over which data may be communicated from, e.g., a source node to a destination node.

In a connection-oriented ATM network the routing of data between network nodes is performed by first establishing a virtual channel connection (VCC) or a virtual path connection (VPC) between a source and destination node. The VCCs/VPCs are normally established at the time a communication session between a source and destination node is initiated. The VCC/VPC established at the time a communication session commences is assigned a unique virtual channel identifier (VCI) and/or virtual path identifier (VPI). The VCC/VPC established at the commencement of a network session is normally maintained for the duration of the session. VCC/VPC correspond to a selected physical route between a source and destination node in the ATM network. The physical route between the source and destination nodes corresponding to the VCC/VPC is normally selected at the time a communication session commences using the routing capabilities of the switches which comprise the ATM network. The VCCs/VPCs are uni-directional in nature. For bi-directional communication, a pair of VCCs/VPCs is required.

ATM networks generally include the ability to establish VCCs/VPCs through the network at the time a communication session is commenced, e.g., through the use of the signaling, the routing and the resource allocation capabilities built into network switches. They also normally include some capability to detect link and/or node failures and the ability to update, on a periodic basis, physical network configuration information. The updating of the network information is normally performed, e.g., when physical nodes are added to, or removed from, the ATM network.

As discussed above, in an ATM network VCCs/VPCs are established at the time a communication session is commenced. The actual physical path, corresponding to a VCC/VPC, can be a function of, e.g., the physical interconnectivity of the source and destination nodes, available link bandwidth in the network at the time the session commences, and the routing method used to establish the virtual connection between the source and destination nodes. Once established, a VCC/VPC will normally be used for the duration of a session without modification.

A network fault condition such as the failure of a link between nodes or the failure of a node in the network can result in the interruption of the transfer of data through the network. Thus, communication using an established VCC/VPC may be interrupted, e.g., because of an interruption of the corresponding actual physical path through the network has occurred. Many networks include, at a network management level, one or more methods for detecting the occurrence of node and/or link faults.

One of the key challenges to network designers is to meet end-user needs for fault tolerance and robustness at the lowest possible cost. User needs for fault tolerance, in terms of the degree of acceptable interruption in a communication session upon detection of a fault condition, will frequently vary from user to user and from application to application. For instance, releasing and then establishing an entirely new connection between a source and destination device may be acceptable in some applications, e.g., where data traffic is bursty, simple session setup procedures are involved, the time required to establish an entirely new connection is relatively small and/or the application user is willing to accept the inconvenience associated with having to re-establish a new connection before being able to complete a communication session. However, for other applications, e.g., such as those with high bandwidth requirements, long holding times and/or rather sophisticated session setup procedures, restoring an existing network connection, interrupted due to a link or node failure, may make more sense than establishing an entirely new connection. Examples of applications where connection restoration may be more desirable then establishing an entirely new connection between a source and destination device include, e.g., some World Wide Web applications, teleconferencing applications and Video on Demand (VOD) applications.

In addition to application considerations, some users may demand, and be willing to pay for, a higher degree of protection against service interruption than other users. For example, stock brokers may be willing to pay a premium to minimize the degree of interruption they will experience in a telephone call due to a node or link failure while the average telephone user may be willing to accept the risk of premature release and the need to initiate a new call to complete a conversation.

Known techniques for protecting against service interruptions generally involve providing physical backup capability in the form of redundant nodes and/or physical interconnects. Providing of redundant physical systems can be a costly proposition. In addition, because the backup is provided at the physical layer, the known systems generally re-route large amounts of data as one unit thereby making it difficult to provide a large degree of flexibility in terms of providing, as an option, differing degrees of protection to users on a per session, individual user, or individual application basis.

In an attempt to address the need for fault tolerance in ATM networks, ATM restoration schemes which focus on the use of backup virtual connections (virtual path connections (VPCs) or virtual channel connections (VCCs)) have been proposed. In such systems, primary as well as backup VPCs and VCCs are created at the time a connection is initially established and are maintained for the duration of the communication session. In such implementations, identifiers (VCI/VPI) for the backup virtual connections are assigned at connection establishment time even though the bandwidth for the backup connection may not be reserved. One problem with this approach is that the assignment of backup virtual connection identifiers at the time a connection is established and the maintenance of such identifiers during a session has the potential of causing VPI/VCI exhaustion which may result in unusable bandwidth in the network. In ATM networks where virtual connections are established on demand, e.g., in the case of switched virtual connections, the problem of VPI/VCI exhaustion can be significant. Another problem with this proposed approach to fault management is that the proposals call for the addition of new protocols to the existing ATM standard, to allow the use of operation and maintenance (OAM) cells to accommodate message passing required by these proposed restoration schemes. The slow process of agreeing upon new standards makes it difficult to achieve a timely and uniform implementation of the proposed schemes across ATM networks from different manufacturers.

In view of the above, it is apparent that there is a need for methods and apparatus which will allow networks to provide different individual users and/or different types of applications differing degrees of protection from service interruption. In addition, it is desirable that such methods and apparatus allow network providers to assign the priority for protection on a per connection basis and offer premium services for customers requiring or desiring a high degree of protection against pre-mature connection release.

In addition to offering a wide degree of flexibility in terms of the degree of protection offered to individual users and/or applications preferably on a per connection or per session basis, it is desirable, from a cost standpoint, that protection from service interruption due to link and/or node failures be capable of being provided at relatively modest cost. To satisfy such a cost requirement the amount of hardware that must be incorporated into a network for the purpose of protecting against service interruption should be minimized, i.e., the provision of redundant circuitry should be minimized or eliminated.

It is desirable that any new network connection restoration methods avoid the assigning of backup VCI/VPI values at the time a connection is established to avoid or minimize the potential problem of VCI/VPI exhaustion.

SUMMARY OF THE PRESENT INVENTION

The present invention relates to methods and apparatus for restoring connections in networks including, e.g., networks which support asynchronous transfer mode (ATM) operation.

The present invention includes methods of restoring virtual connections affected by link or node failures in, e.g., ATM networks, instead of establishing a completely new connection between the source and destination devices. The methods of the present invention take advantage of unused network capacities to redirect network traffic around a failed link or node, to thereby restore an existing connection between a source and destination device.

Various embodiments of the present invention utilize the capabilities of ATM switches to perform routing and connection setup operations to re-route network traffic around a failed link or node. In accordance with one embodiment of the present invention VPI/VCI values for virtual connections between switches established to re-route network traffic around failed nodes or links are assigned at the time of re-routing as opposed to the time at which a connection between a source and destination device is first established. Thus, the potential problem of VPI/VCI exhaustion present in some known restoration techniques is avoided.

The methods of the present invention rely heavily on exiting ATM switch capabilities and messages supported by the existing ATM standard. Minor additions to the messaging capabilities included in the existing ATM standard are suggested to support a re-route connection set-up message and a re-route capacity release message. Both messages are similar to current connection set-up messages and capacity release messages but would indicate to a switch that the requested operation is in response to a re-route request.

Switch call acceptance criterion is adjusted in various embodiments to give priority to accepting re-route requests over new calls. A switch which has reserved capacity in response to a re-route connection set-up message for a specific call, in accordance with one embodiment of the present the invention, does not release the reserved capacity in response to a subsequently received re-route release message corresponding to the same failure event for the same specific call. This differs from the response to a conventional capacity release message which would be a simple release of the capacity reserved for the call identified in the release message. This response to a re-route release message avoids the problem of releasing capacity that is being used in a re-routed path while freeing resources reserved for a portion of the original call path which is no longer used due to re-routing.

In one embodiment, ATM assured mode data transport operation on signaling channels is employed to detect node and/or link failures. In such an embodiment, the signaling ATM adaptation layer (SAAL) polls the peer receiver at a specific preselected time interval. If a response is not received within another preselected time interval, the signaling connection is considered broken and the connection restoration methods of the present invention are invoked. This approach to link and node failure detection builds on the capabilities already implemented in known ATM switches to support assured mode signaling transport. This failure detection method may provide fast detection of failures with less extra overhead than approaches that use ATM OAM performance monitoring capabilities to detect node and/or link failures.

In addition to failure detection methods, the present invention is directed to various connection restoration methods applicable to, e.g., pre-planned hop-by-hop routing embodiments, pre-planned source routing embodiments, and dynamic source routing embodiments.

In accordance with one connection restoration method based on pre-planned hop-by-hop routing, the neighboring upstream switch from the failed link or node, e.g., the switch adjacent the failed link or node on the side close to the source device, attempts to find an alternative route to the destination device on a per virtual connection basis. Alternative route information programmed into the switch's routing table can be used in finding routes around a failed link or node. One embodiment of this particular restoration methodology is implemented using capabilities of the current ITU-T B-ISUP signaling protocol.

In accordance with another connection restoration method of the present invention directed to the use of pre-planned source routing, neighboring upstream switches to a failed link or node send re-route request messages back to the corresponding source(s) of the affected connections. Upon receiving such a message, the source node attempts to find an alternative route around the failed link or node. As with the case of the method used with pre-planned hop-by-hop routing, the attempt to find an alternative route may involve the use of alternative route information programmed into a switch's routing table. In one particular embodiment, this method is implemented using capabilities of the PNNI signaling protocol developed in the ATM Forum for private ATM networks. The PNNI signaling protocol used in such an embodiment is based on a subset of UNI Signaling 4.0.

Another embodiment of the present invention is directed to a connection restoration method based on dynamic source routing. In such an embodiment, the neighboring upstream nodes to the failed link or node send re-route messages back to the corresponding source node(s) of the affected connections. In response to such a message, the source node attempts to find an alternative route to the destination device in order to restore the connection. This method is similar to the restoration method used when pre-planned source routing is employed. However, the alternative route is calculated at the time when new network state updates have been received or when the re-route request is received by the source node. In one particular embodiment this method is implemented using capabilities of both the PNNI signaling protocol and the PNNI routing protocol developed in the ATM Forum for private ATM networks.

Various apparatus for implementing the above described methods of the present invention are discussed in detail below. Additional methods and features of the present invention are also discussed in the detailed description which follows.

BRIEF DESCRIPTION OF THE DRAWINGS

FIGS. 3A and 3B are exemplary routing tables suitable for use as the routing table of switch 110 and switch 118 respectively of the FIG. 1 embodiment when pre-planed hop-by-hop routing is used.

FIG. 3C is an exemplary routing table, suitable for use as the routing table of switch 110 of the FIG. 1 embodiment when pre-planed source routing is used.

DETAILED DESCRIPTION

As discussed above, the present invention is directed to methods and apparatus for restoring connections in networks including, e.g., networks which support asynchronous transfer mode (ATM) operation. In accordance with the present invention unused network capacity is used for restoring connections between a source and destination device which are interrupted due to, e.g., a link or node failure. The connection restoration process of the present invention can be applied, in various exemplary embodiments, on an application by application basis with differing degrees of protection against premature connection release on an individual application or user bases. The degree of fault protection provided to a particular application and/or user may be determined as a function of the network user's willingness to purchase protection against network failure and/or whether it is more efficient from a network perspective to restore an interrupted connection as opposed to establish an entirely new connection between a source and destination device.

Figure 1:
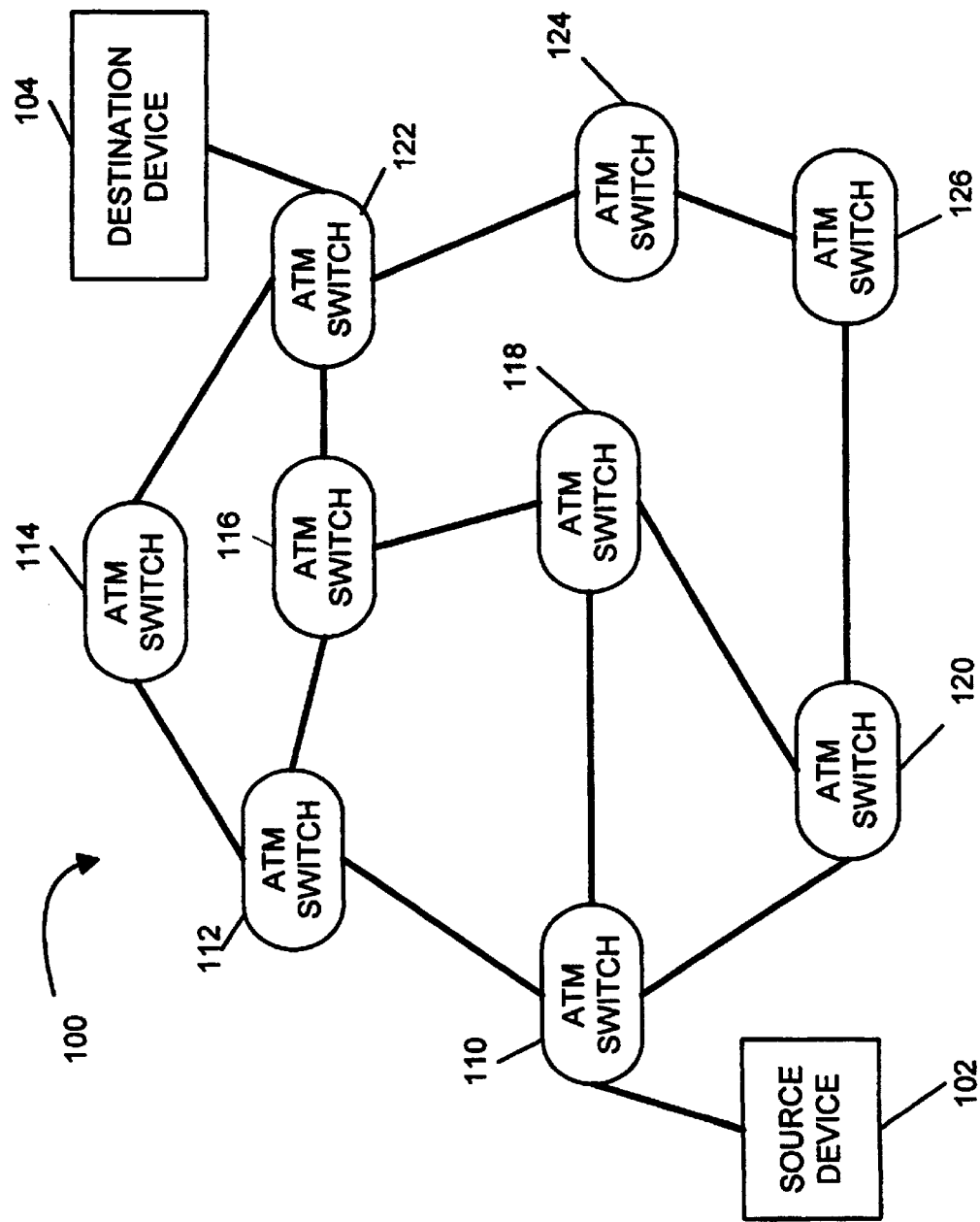
FIG. 1 illustrates an ATM switching network implemented in accordance with one embodiment of the present invention.

Referring now to FIG. 1, there is illustrated an exemplary ATM network 100 in which the connection restoration method of the present invention can used. As illustrated, the ATM network 100 includes a plurality of ATM switches 110, 112, 114, 116, 118, 120, 122, 124, 126. Each of the illustrated ATM switches represents a node in the ATM network 100. Lines connecting the ATM switches illustrated in FIG. 1 represent physical links between the nodes which support the bi-directional communication of digital signals. As discussed above, the digital signals, in the form of packets or cells, can include voice, video, network control and/or various other types of information.

In the illustrated network, a source device 102 is coupled to the ATM switch 110 and a destination device 104 is coupled to the ATM switch 122. The source and destination devices may be, e.g., telephones in a telephone network embodiment. The term source device is used in the present application to refer to a device which initiates a communication session over the ATM network 100. For example, a device which initiates a call to another device via the ATM network 100 would be a source device. In the present application the term "call" is used to refer to any type of communication session between a source and destination device. Accordingly, in the present application a "call" may, but need not be, a voice telephone call. The term destination device is used to indicate a device to which a source device is attempting to communicate.

The exemplary ATM network illustrated in FIG. 1 could be used to provide, e.g., video on demand (VOD) services to the television sets of VOD subscribers. In such an embodiment, the source device 102 could be a television set-top box used to transmit viewing requests over the ATM network and for receiving and decoding video data in response to the viewing request. The destination device 104 could be a video server in the form of an intelligent peripheral which is capable of receiving video requests via the ATM network 100 and for providing video data over the ATM network to the source device 104 in response to such requests. Video signals, e.g., movies, normally take a relatively long time to transmit. VOD applications are an example of applications with long hold times that may benefit from protection from premature release due to node or link failure.

While a single source device 102 and destination device 104 are illustrated in the ATM network 100, it is to be understood that the network may include a plurality of such devices coupled to one or more of the ATM switches at any given time.

As discussed above, the ATM network 100 may be used to support various types of applications. However, for purposes of explanation, it will be assumed that the ATM network is being used to route telephone calls originating from the telephone (the source device 102) of a calling party and terminating at the telephone (the destination device 104) of a called party.

Figure 2:
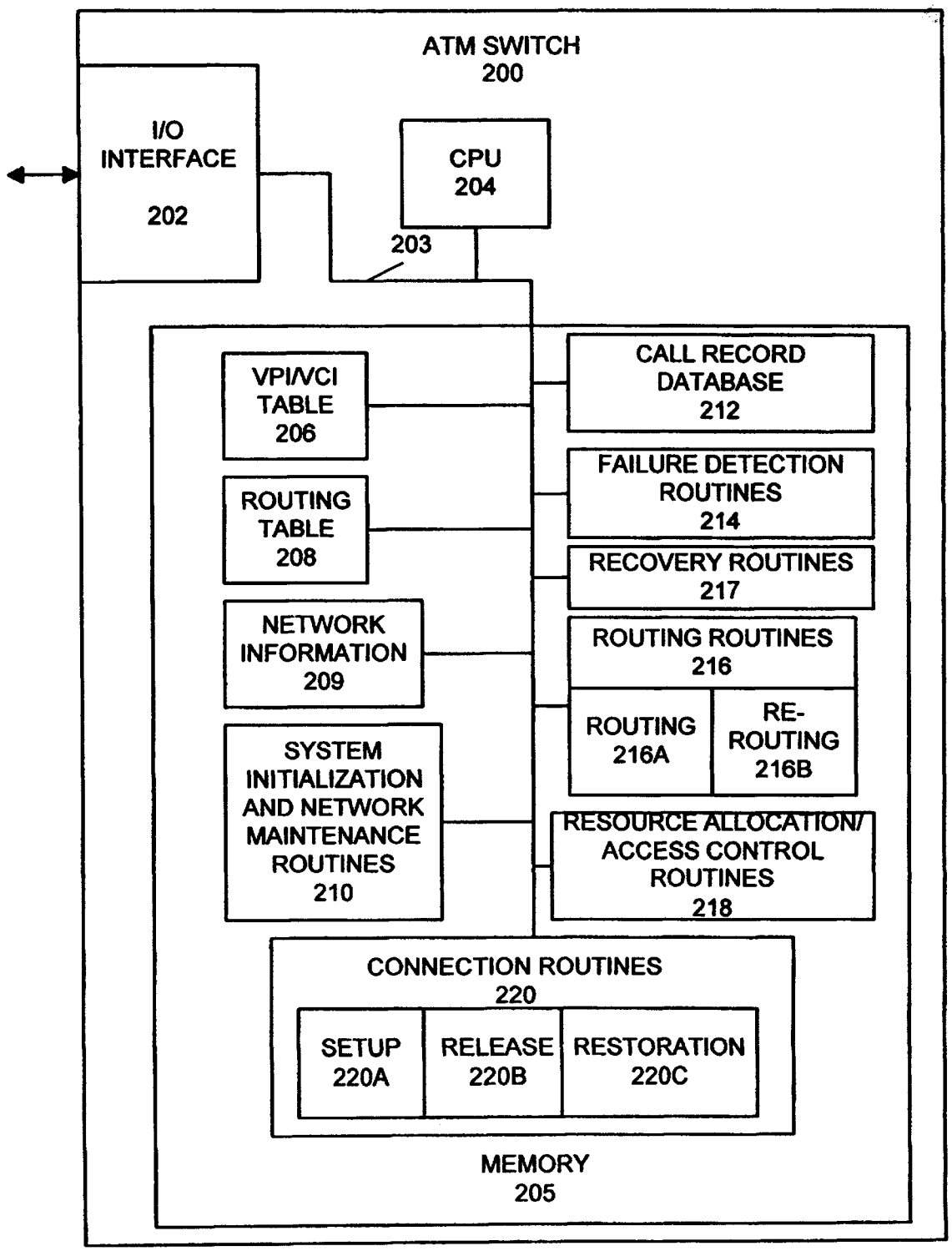
FIG. 2 is a block diagram of an ATM switch suitable for use as any one of the ATM switches of the network illustrated in FIG. 1.

Referring now to FIG. 2, there is illustrated an ATM switch 200 implemented in accordance with an exemplary embodiment of the present invention. The ATM switch 200 may be used as any one of the ATM switches illustrated in FIG. 1.

As illustrated in FIG. 2, the ATM switch 200 comprises an input/output (I/O) interface 202, a bus 203, a CPU 204, and a memory device 205. The bus 203 is used to couple the various elements of the ATM switch 200 together. The I/O interface 202 is used for coupling the ATM switch 200 and the components included therein to external devices and other switches. One of the I/O interface's functions is to translate between protocols used by devices and/or switches coupled to the ATM switch 200 and internal signals and protocols used by the ATM switch 200. The I/O interface 202 includes electrical and/or optical circuitry required for coupling the ATM switch components to the external devices and switches coupled thereto.

The ATM's CPU 204, under control of various routines stored in the memory 205, performs various operations associated with routing information through the ATM network. The various operations include, e.g., establishing network connections, assigning VPI/VCIs, reserving and releasing network resources, etc.

Figure 18A:
FIG. 18A illustrates a call record which may be used as one of the call records stored in the call record database 212 illustrated in FIG. 2.

While the memory 205 is illustrated as a single entity in FIG. 2 it may comprise one or more distinct physical storage devices. The memory 205 includes a VPI/VCI table 206, a routing table 208, a network information database 209, and a call record database 212. The VPI/VCI table is used to store VCC and VPC information associated with the routing of individual cells. VPIs and VCIs are generated at the time a virtual connection (VCC or VPC) is first established, e.g., between a source and destination device and are normally maintained for the duration of the corresponding virtual connection absent a network failure. The routing table 208 is used to store information that is used when determining the physical path through the network 100 to be used to route a connection at the connection establishment phase. As will be discussed below, the content of the routing table 208 will depend on the type of routing that is implemented. The network information database 209 includes information about the physical connectivities, link states, etc. of the network 100. The call record database 212 includes a record for each established call being handled by the switch 200. For each call, a call record 1800 such as that illustrated in FIG. 18A is maintained in accordance with one embodiment of the present invention. As illustrated in FIG. 18A each call record 1800 includes a call identifier, a source switch identifier, and a destination switch identifier. In addition, in accordance with the present invention a setup message switch identifier and a setup count is included in the call record. The setup message switch identifier identifiers the switch responsible for generating the setup message which resulted in the call record being created or updated. In the case of an initial setup message, the source switch and setup message switch identifiers will be the same. However, if a re-route operation occurs the setup switch identifier will be updated to store the identifier of the switch which is the source of the re-route message. The setup count is a value which is set to, e.g., zero, when a call is initially established. If the call record is modified, e.g., in response to a re-route setup message, the re-route count is updated using a re-route count value obtained from the re-route setup message.

In addition to the setup count, the call record may include additional information. The additional information may, e.g., identify an application or user associated with a call, the degree of protection against premature connection termination to be provided, and assigned virtual channel and/or path identifier (VPI/VCI) values associated with an identified call.

In addition to the various data tables and data bases stored in the memory 205, the memory 205 includes a plurality of routines used to control the CPU 204 and thus the operation of the switch 200. For example, the ATM switch 200 includes system initialization and network maintenance routines 210, network failure detection routines 214, recovery routines 217, resource allocation routines 218 and signal connection routines 220.

The initialization and network maintenance routines 210 are responsible for switch initialization operations, the storing and updating of network configuration information in the network information database 209 and for performing ATM operation and maintenance (OAM) functions.

The connection routines 220 include setup routines 220A, release routines 220B and restoration routines 220C. The setup routines 220A are responsible for establishing virtual connections (VCCs/VPCs) and assigning VPI/VCI values to a connection at the time a call is initiated assuming that the switch 200 has sufficient capacity to handle the call.

The release routine 220B is used for releasing locally reserved capacity for handling a terminated call or re-routed call. The restoration routines 220C rely on the setup routines to interact with the resource allocation routine 218 to determine if the switch 200 has the capacity to handle an additional connection in response to an initial setup message or a re-route setup message.

The resource allocation routines 218 assess the switch's current communications load, e.g., by evaluating the portion of the switch's resources which are reserved for use by established connections (calls). If the capacity required to handle the call which is being initiated or re-routed plus the capacity already reserved for handling ongoing connections does not exceed a preselected portion of the switch's capacity, e.g., 90%, the resource allocation routines will reserve the capacity required to service the call being initiated or re-routed. In addition, the resource allocation routines will indicate to the setup routines 220 that they can proceed with the connection establishment process and the assignment of virtual path and virtual channel identifiers for the call.

If the resource allocation routines 218 determine that the switch 200 does not have sufficient capacity to handle an additional call that is being initiated or re-routed, e.g., if the establishment of an additional connection would result in the preselected maximum portion of the switch's capacity being exceeded, the resource allocation routine 218 indicates to the setup routine 220A that the initiated call can not be handled. In such a case, VPI/VCI values are not assigned to the call being initiated. The setup routine 220A indicates to the release routine 220B to release resources reserved for the partially established connection and notify the other involved switches of the inability of the switch 200 to handle the call in a manner that is consistent with the ATM protocol.

In accordance with the present invention different call acceptance criterion can be used for re-routed and initial call setup requests. This allows re-route setup messages to be favored over new call setup messages.

The setup routines 220 work in conjunction with the routing routines 216, consisting of routing routine 216A and re-routing routine 216B, in determining the path via which the call being initiated is to be routed through the ATM network 100. The routing routines 216 will vary depending on the type of routing implemented in the ATM network 100. The routing routines may support, e.g., one or more of the following known routing methods: 1) pre-planned hop-by-hop routing, 2) pre-planned source routing; and/or 3) dynamic source routing. Information, to be discussed in detail below, stored in the routing table 208 is used by the routing routines 216 when determining, at the call establishment phase, the route to be taken through the ATM network 100.

The setup routine 220A, routing routine 216A and the portion of the resource allocation routine 218 used when a new call is initiated, may be the same as, or similar to, known ATM setup, routing and resource allocation routines.

In addition to the setup routines 220A discussed above, the connection routines include release routines 220B. The release routines 220B include routines for releasing switch capacity reserved for individual calls e.g., in response to a connection release message or a re-route release message implemented in accordance with the present invention.

ATM messaging used in the network 100 supports the capability of transmitting a message, e.g., used when a call is terminated, instructing all the network switches to release any capacity that may have been reserved for the terminated call. The release routines 220B are responsive to the receipt of such a message. The release routines 220B are also responsible for generating such a message, e.g., when the ATM switch 200 is responsible for initiating the termination of a call connection. For identification purposes release messages normally include the unique call identifier assigned to the call being terminated.

Known ATM release messages result in the release of the capacity associated with a particular call at all the network switches which receive the release message.

As will be discussed below, the present invention proposes adding to the standard ATM release messaging capability, the ability to transmit and respond to a restoration release (RR) message. A restoration release message can be the same as a conventional release message with the exception of, e.g., a single bit used to distinguish between a regular release message and a restoration release message which is generated, e.g., as part of a connection restoration operation. A restoration release message is used, as will be discussed below, in accordance with the connection restoration process of the present invention, to release capacity reserved at switches through which an ongoing call is no longer routed. Such a situation may arise when the restoration method of the present invention restores a call by re-routing it around a failed node or link. Because the restoration release message of the present invention does not result in the release of reserved capacity for a particular call at all the switches in a network, switch capacity which is no longer used due to call re-routing can be released without affecting the on-going call.

The failure detection routine 214 is responsible for monitoring the status of the links between the ATM switch 200 and other switches coupled thereto to detect node and/or link failures.

Figure 4A:
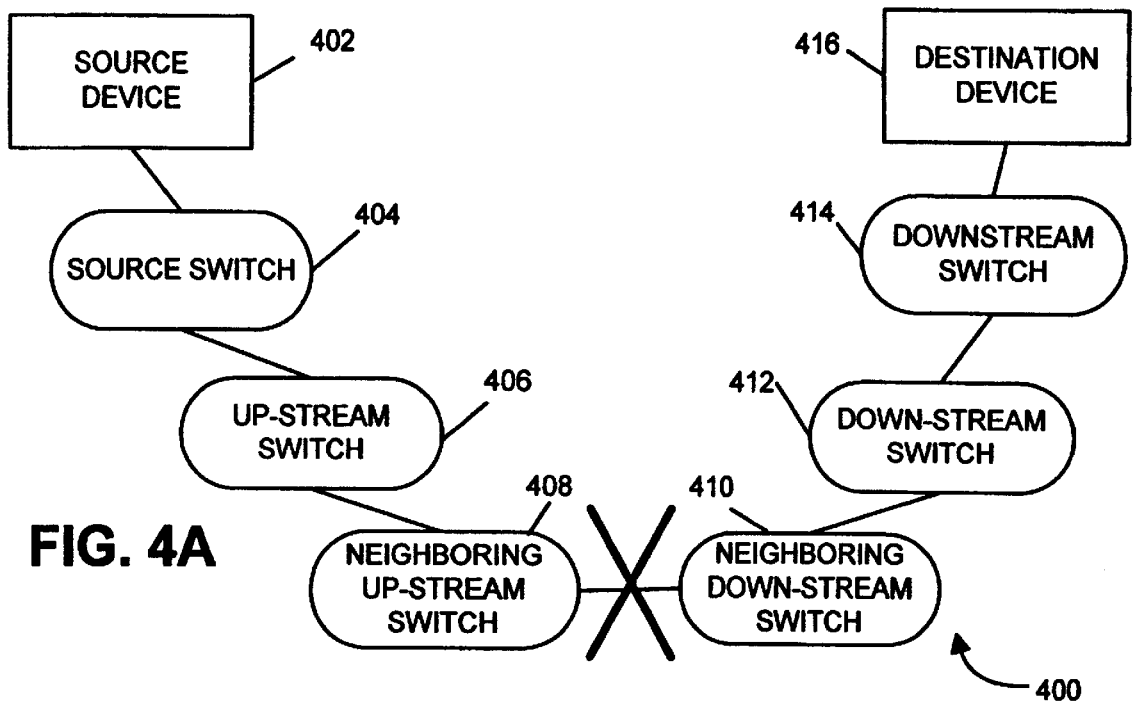
FIG. 4A illustrates an ATM network with a failed link.
Figure 4B:
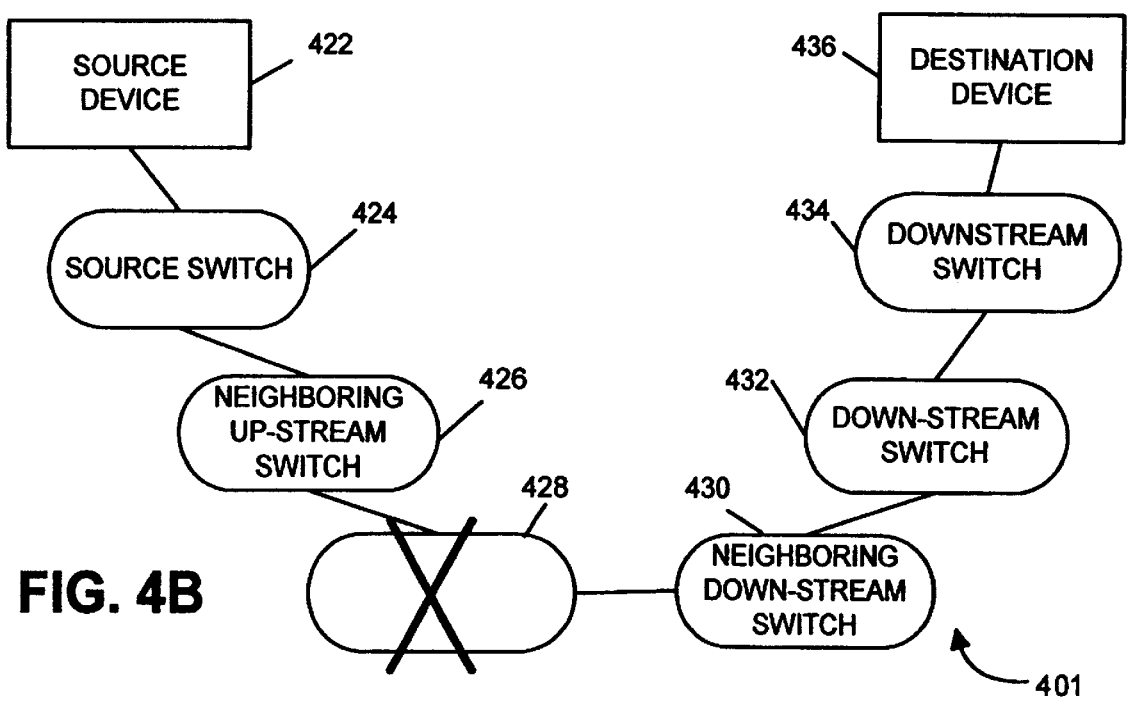
FIG. 4B illustrates an ATM network with a failed node.

FIGS. 4A and 4B illustrate ATM networks 400, 401 which will be used to explain the terminology used herein to describe a switch relative to a failed node or link.

For purposes of explaining the restoration method of the present invention, a switch will be referred to as a neighboring up-stream switch for a connection if it is on the source device side of a failure point, e.g., if it is located on the side of the device which initiated a call affected by a failed link or a failed node (e.g., the calling party's side in a telephone call). A switch will be referred to as a neighboring down-stream switch for a connection if it is on the destination device side of a failure point, e.g., if it is located on the side of the device which was the destination for a call affected by the failed link or the failed node (e.g. the called party's side in a telephone transaction).

Referring now to FIG. 4A, there is illustrated an ATM network comprising a source device 402, a destination device 416, and a plurality of ATM switches 404, 406, 408, 410, 412, 414. Switch 404 is directly coupled to the source device 402, and serves as the originating switch for calls made by the source device 402. For this reason switch 404 is called the source switch.

In FIG. 4A the X located between switches 408 and 410 is used to indicate a link failure between these two switches. Switches 404, 406 and 408 are located up-stream of the link failure, i.e., on the source side, and are therefore described as up-stream switches. Switch 408, the up-stream switch immediately adjacent the failed link, is referred to as the neighboring up-stream switch.

Switches 410, 412, 414 are located on the destination device side of the failed link and are therefore described as down-stream switches. Switch 410, the down-stream switch immediately adjacent the failed link, is referred to as the neighboring down-stream switch.

FIG. 4B illustrates an ATM network 401 comprising a source device 422, a destination device 436, and a plurality of switches 424, 426, 428, 430, 432, 434. In the network 401, an X is used to indicate that switch 428 has failed. Accordingly, the network 401 includes a failed node, i.e., the switch 428. In the example of FIG. 4B switches 424 and 426 represent upstream switches (nodes) relative to the failed node 428. In this example, switch 426 which is immediately adjacent the failed node 428 is the neighboring up-stream switch.

In the network 401, switches 430, 432, 434 represent down-stream switches. In this example, switch 430 which is immediately adjacent the failed node 428 is the neighboring down-stream switch.

Operation of the restoration method of the present invention will now be discussed in the context of a pre-planed hop-by-hop routing embodiment. In such an embodiment, one or more alternative paths are programmed into the routing table of the switches forming the ATM network of the present invention. The primary path is used in the case of normal routing operations while the alternative paths are used during a connection restoration operation or when the primary path is unavailable for some reason, e.g., not enough capacity available.

As will be discussed below, the recovery operations performed by a switch 200 upon detection of a failure in accordance with the present invention will vary depending on the type of routing implemented and the position of the switch 200 relative to the node or link failure.

In accordance with the present invention, in a pre-planned hop-by-hop routing embodiment, the routing tables of the various switches which comprise the ATM network are programmed with primary as well as alternative routes to be used in the event of a node or link failure. FIG. 3A illustrates the routing table for the single ATM switch 110 in a pre-planned hop-by-hop routing embodiment. In a hop-by-hop embodiment, the switches only store the routing information needed to reach the next node (switch) in a path toward the destination. FIG. 3B illustrates the routing table for switch 118 in a pre-planned hop-by-hop routing embodiment. Note that in such an embodiment, switch 118 will normally route calls transmitted from source device 102 to destination device 104 via ATM switch 116. However, in accordance with the present invention, in the event of a failure of switch 116 or failure of the link connecting switches 118 and 116, the alternative route via ATM 120 will be used in accordance with the present invention.

FIG. 3C illustrates a routing table used by the source switch 110 in pre-planned source routing embodiment of the present invention. In such an embodiment, the source switch 110 stores information on the full path to be used through the network to reach the destination device 104. Note that two alternative routes to device 104 involving the use of different switches, are included in the FIG. 3C routing table.

In accordance with the present invention, conventional call set-up operations and routing techniques are used to initially establish a call connection between a source device 102 and destination device 104. For example, in response to a request by the source device 102, a connection, represented by the arrows shown in FIG. 11, between the source device 102 and destination device 104, may be established using switches 110, 118, 116, and 122 and the primary path information stored in one or more of the switches routing tables when pre-planned routing is used.

During the call establishment process, as is known in the ATM art, VPI/VCI values are assigned to the call, identified by a unique call identifier, which is being initiated. In addition, the call record databases 212 are updated to reflect the ongoing calls established. Note that in accordance with the present invention backup VPI/VCI values are not assigned during initial call setup thereby avoiding the potential problem of VPI/VCI exhaustion encountered in various known fault management techniques. During initial call setup, the primary routing paths are normally used to establish the connection between the source and destination devices 102, 104.

Because of the similarity between the method of the present invention as implemented in the case of the various routing embodiments, the method to be used in a pre-planned hop-by-hop routing embodiment will first be described in detail followed by a description of the pre-planned source routing and dynamic routing embodiments which will be more briefly described.

Figure 5:
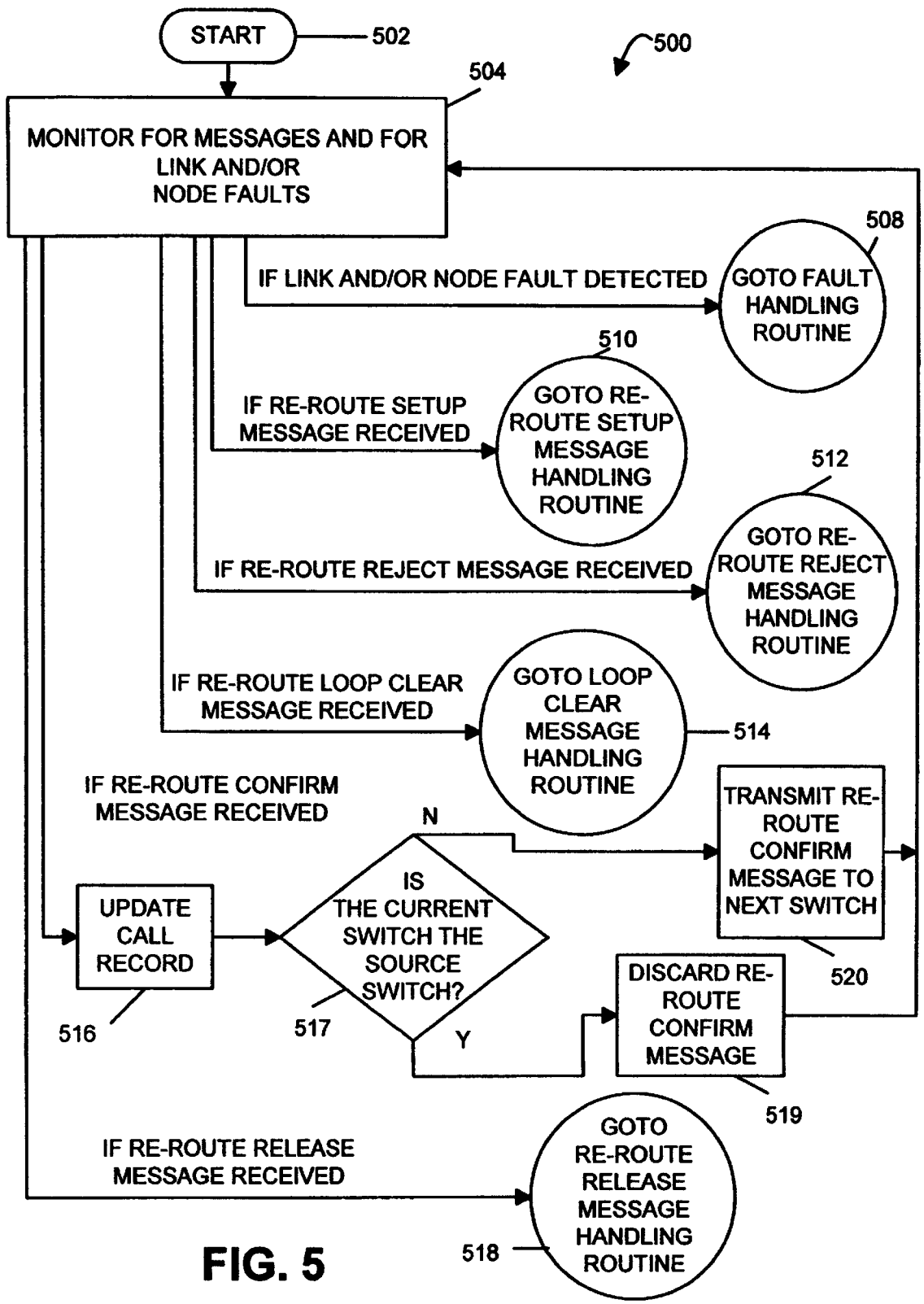
FIG. 5 is a flow chart illustrating a method of the present invention suitable for use with pre-planned hop-by-hop routing.

FIG. 5 is a flow chart illustrating the steps involved with the failure detection and connection restoration process of the present invention. These steps are performed in a pre-planned hop-by-hop routing embodiment, after a connection is established.

The call processing and fault management method of the present invention illustrated in FIG. 5 is performed by each switch in the ATM network 100. The method 500 begins with start step 502 wherein various routines associated with the method of the present invention are initialized. Operation progresses from step 502 to step 504 which is a monitoring step. In step 504, the CPU 204 of the ATM switch 200 monitors for link and/or node faults, and various types of messages.

In accordance with one embodiment of the present invention, monitoring for link and/or node faults is performed using assured data transfer mode features for signaling channels supported by the ATM switches. In such an embodiment, at switch start-up time, prior to starting the method illustrated in FIG. 5, each of the switches in the ATM network 100 enters assured data transfer mode on the signaling channels. Thus, assured mode signaling transfer is established between neighboring ATM switches across each interface connecting them in the ATM network 100 prior to startup of the call monitoring and processing routine 500.

As is known in the ATM art, when assured data transfer mode is used, the signaling adaptation layer (SAAL) polls the neighboring switch(s) (peer receiver(s)) at a specific predetermined time interval. If a response is not received within another predetermined time interval, the signaling connection (link) over which the polling took place is considered broken. The SAAL polling operation is one of the operations performed by the CPU 204 under the control of the failure detection routines 214. In one embodiment, in step 504, it is the response to a polling operation which is monitored for in order to detect node and/or link faults. The absence of an expected response indicates a broken signaling connection.

The SAAL polling time interval can be made to depend on the activity level of the signaling connection being monitored. In one embodiment a smaller polling time interval is used when the signaling connection is actively sending messages.

A broken signaling connection can be due, e.g., to either a node or link failure. If, as a result of a SAAL polling operation, a broken signaling connection is detected, a fault management operation is initiated by the recovery routines 217. The recovery routines 217 include various routines, e.g., illustrated in FIGS. 6 through 9, used for responding to a detected fault condition.

In one particular embodiment of the present invention, the step of monitoring for faults is implemented as part of the SAAL layer management routines implemented at each ATM switch.

Figure 6:
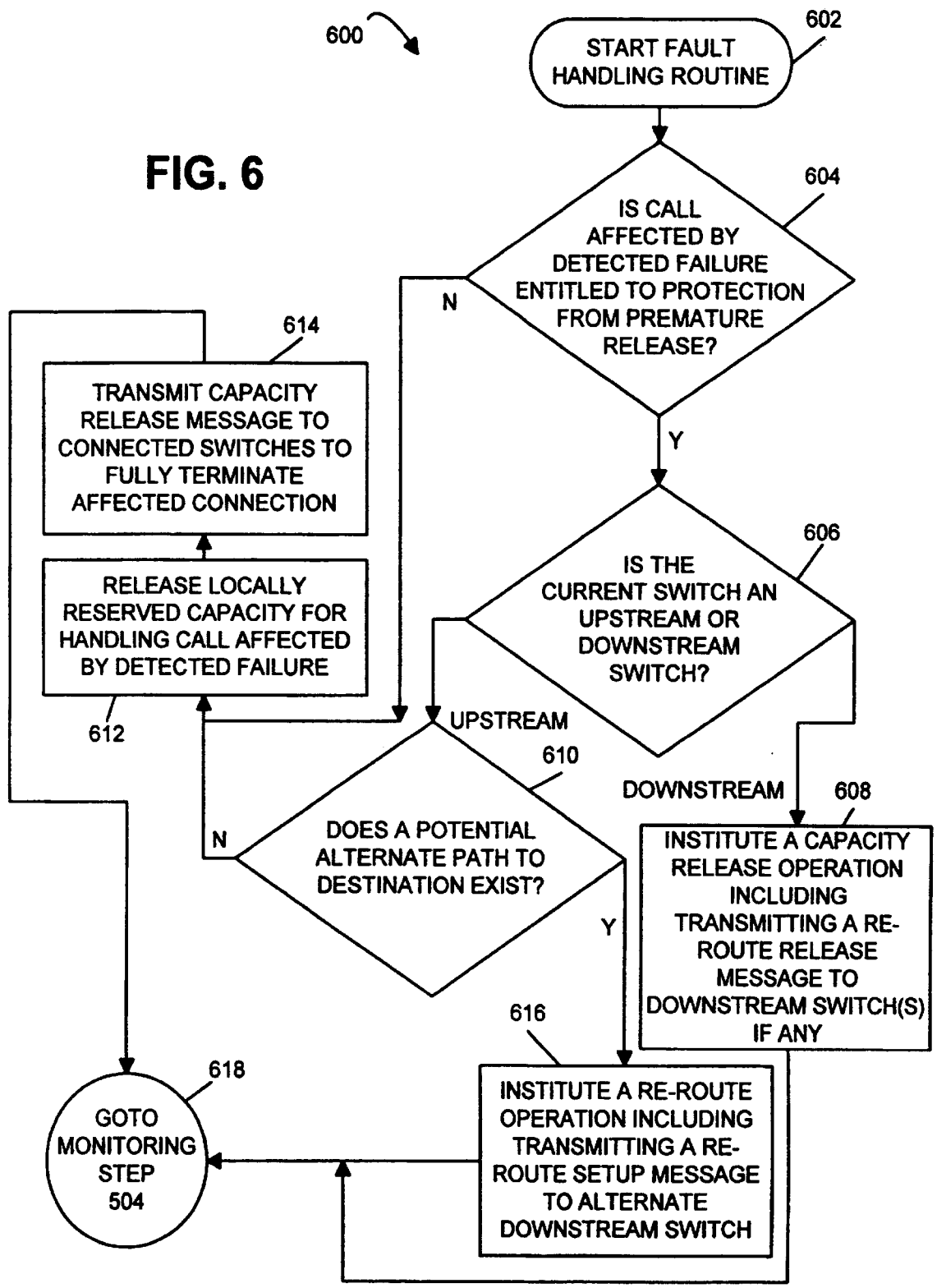
FIG. 6 illustrates a fault handling routine implemented in accordance with the present invention.

In such an embodiment, the SAAL layer management is responsible for triggering the recovery mechanism, e.g., fault handling routine, illustrated in FIG. 6, via the local switch management routines. An alternative to the above described fault detection technique is to use ATM cell header CRC errors detected or to use known ATM OAM fault detection techniques to detect node and/or link faults and activate the recovery mechanism of the present invention.

If in step 504 a fault is detected operation progresses to step 508 which results in operation proceeding to the fault handling routine 600 illustrated in FIG. 6.

FIG. 6 illustrates an exemplary fault handling routine 600 implemented in accordance with one embodiment of the present invention. The fault handling routine 600 begins with the start step 602 wherein various initialization operations associated with executing the fault handling routine 600 are performed by the CPU 204. Operation progresses from step 602 to step 604 wherein a determination is made as to whether the call affected by the detected fault is entitled to protection from premature release.

As discussed above, in accordance with the present invention, whether or not a particular call is entitled to protection from premature release is determined on a call by call basis and may be a function of a user's willingness to subscribe to a service offering such protection and/or a function of the type of application to which the call corresponds. Call type information included in the initial setup messages used to establish the call affected by the fault and stored in the switch's call record database 212 may be used to make the determination as to whether the call is entitled to protection from premature release.

If, in step 604 it is determined that the call affected by the detected fault is not entitled to protection from premature release, e.g., because it has a call type which indicates a call of a type which should not receive such protection, e.g. a conventional voice telephone call type, operation progresses to step 612. In step 612 the switch releases the locally reserved capacity for handling the call affected by the detected failure. This includes, e.g., terminating the local connections, releasing the bandwidth, the VPI/VCI values and the corresponding call record storage space at the switch reserved for the affected call.

Operation progresses from step 612 to step 614 wherein the switch detecting the fault transmits release messages to the involved switches to terminate the affected calls. The release messages include the unique identifier assigned to the affected call and instructs the receiving switches, as is known in the art, to release any capacity reserved for the call identified in the message and to thus fully terminate the affected call.

After transmission of the release message in step 614 switch operation returns to the monitoring step 504 via step 618.

If, however, in step 604 it was determined that the affected call was entitled to protection from premature release, e.g., because the stored call type information associated with the call indicated that the call corresponded to a VOD application, operation progresses to the next decision step 606. In step 606 a determination is made as to whether the switch detecting the fault is an upstream or downstream switch relative to the fault. This determination is made by reviewing the call record information and determining if the faulty link or node is located on the source or destination side of the node detecting the fault condition.

The action taken by the switch 200 detecting a fault is a function of whether the switch is located upstream to a fault in which case the switch is an upstream neighboring switch or downstream in which case the switch is a downstream neighboring switch. Upstream neighboring switches are generally responsible for initiating the process of establishing an alternative path to the destination device while downstream neighboring switches are generally responsible for initiating the release of network capacity reserved by switches which are no longer used as part of the path to communicate information between the source and destination devices.

If in step 606 it is determined that the switch detecting the fault is an upstream switch for an affected call operation progresses to step 610. In step 610 the upstream switch determines, e.g., from the alternative path information stored in its routing table, if a potential alternative path to the destination device exists. If no potential alternative path can be identified operation progresses to step 612 and steps are taken to terminate the call affected by the detected fault.

If, however, in step 610 a potential alternate path to the destination device 104 is identified by the switch, e.g., an alternative path is found in the switch's routing table, and resource allocation routine indicates that the additional connection can be accommodated operation progresses to step 616. In step 616 a re-route operation is initiate. This involves assigning new VPI/VCI values to be used in communicating to the next switch in the new path, updating the switch's call record database 212 and transmitting a re-route set-up message to the downstream switch identified as being part of an alternative path to the destination device 104.

Figure 18B:
FIG. 18B illustrates a re-route setup message which may be used in accordance with one embodiment of the present invention.

A re-route set-up message will normally include the unique call identifier previously assigned to the call being re-routed and other information included in an ATM call setup message of the type used to initiate a call transaction. A re-route setup message implemented in accordance with the present invention can include all of the information found in a conventional ATM call set-up message but have at least one different bit used to identify the message as a re-route, as opposed to initial call, set-up message. FIG. 18B illustrates a re-route setup message 1802 used in accordance with one embodiment of the present invention. As illustrated, the re-route setup message 1802 includes the call identifier, the source switch identifier, and the destination switch identifier for the call being re-routed. In addition, the re-route setup message includes the identifier of the switch initiating the re-route setup message, e.g., the identifier of the neighboring upstream switch detecting the failure in the case of a hop-by-hop routing embodiment. The re-route setup message also includes a re-route count. This value corresponds to the re-route count obtained from the call record of the switch generating the setup message incremented by 1 to reflect the occurrence of a new failure event. The re-route setup message also includes additional information, e.g., path information, etc. Note that the re-route setup message includes much of the information required to update a switch's call record upon rerouting.

Figure 11:
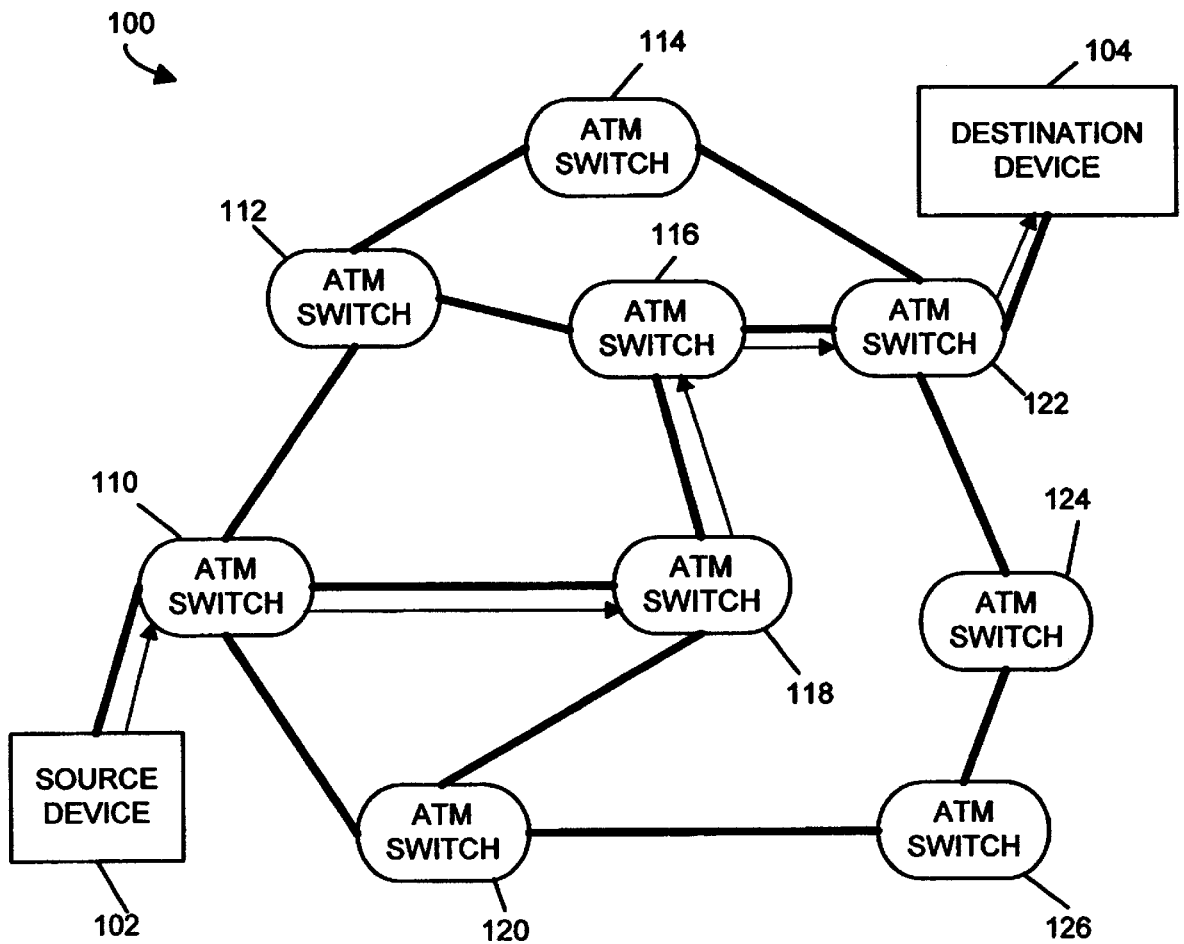
FIG. 11 is a diagram illustrating the path through the ATM network illustrated in FIG. 1 used by a virtual connection to communicate data between a source and destination device in the absence of link or node failures in one particular embodiment.

Assuming, e.g., in the FIG. 11 example that upstream switch 118 detected the failure of node 116, in step 610 the alternative path stored in the routing table of FIG. 3B would be selected. If the resource allocation routine indicates that there is enough capacity to accommodate this additional connection on the alternative path, a re-route operation is initiated by switch 118 in step 616 using the alternative route which includes ATM switch 120.

Once a re-route operation has been initiated by the neighboring upstream switch in step 616 operation progresses via step 618 to the monitoring step 504.

If, after detection of a failed node or link, it is determined in step 606 that the switch detecting the fault is a downstream switch operation progresses to step 608. By virtue of the switch detecting the fault, it indicates that the switch is a neighboring switch.

It is the responsibility of the neighboring down-stream switch, upon detecting a fault, to initiate the process of releasing the bandwidth reserved on the original call routes which is no longer used for routing data for the call affected by the detected fault. This occurs in step 608 wherein a capacity release operation, including the transmitting of a re-route release message to downstream switch(es), if any exist, is performed. The release operation includes releasing the network resources reserved locally for the affected call, e.g., the bandwidth, the VPI/VCI values, and the corresponding call record information stored in the switch. In addition, one or more re-route release messages are generated and transmitted along the original path corresponding to the affected call or calls toward the affected call's destination switches.

To reduce the overhead associated with re-route release messages, one re-routing release message could be sent for multiple affected connections using the same output link at the neighboring down-stream switch to reach their destination switches. In such an implementation, the re-routing release message would include the unique call identifiers of multiple affected calls. The exact number of connections associated with each resource release message depends on the pre-planned route of the calls affected by the failure. It can also depend on the trade-offs between bandwidth overhead and the resource release message generation latency.

From step 608 operation progresses to the monitoring step 504 via step 618.

In step 504, the receipt of messages may be detected in addition to the detection of fault conditions. The action taken by a switch 200 in response to detecting a message in step 504 depends on the type of message that is received.

Figure 7A:
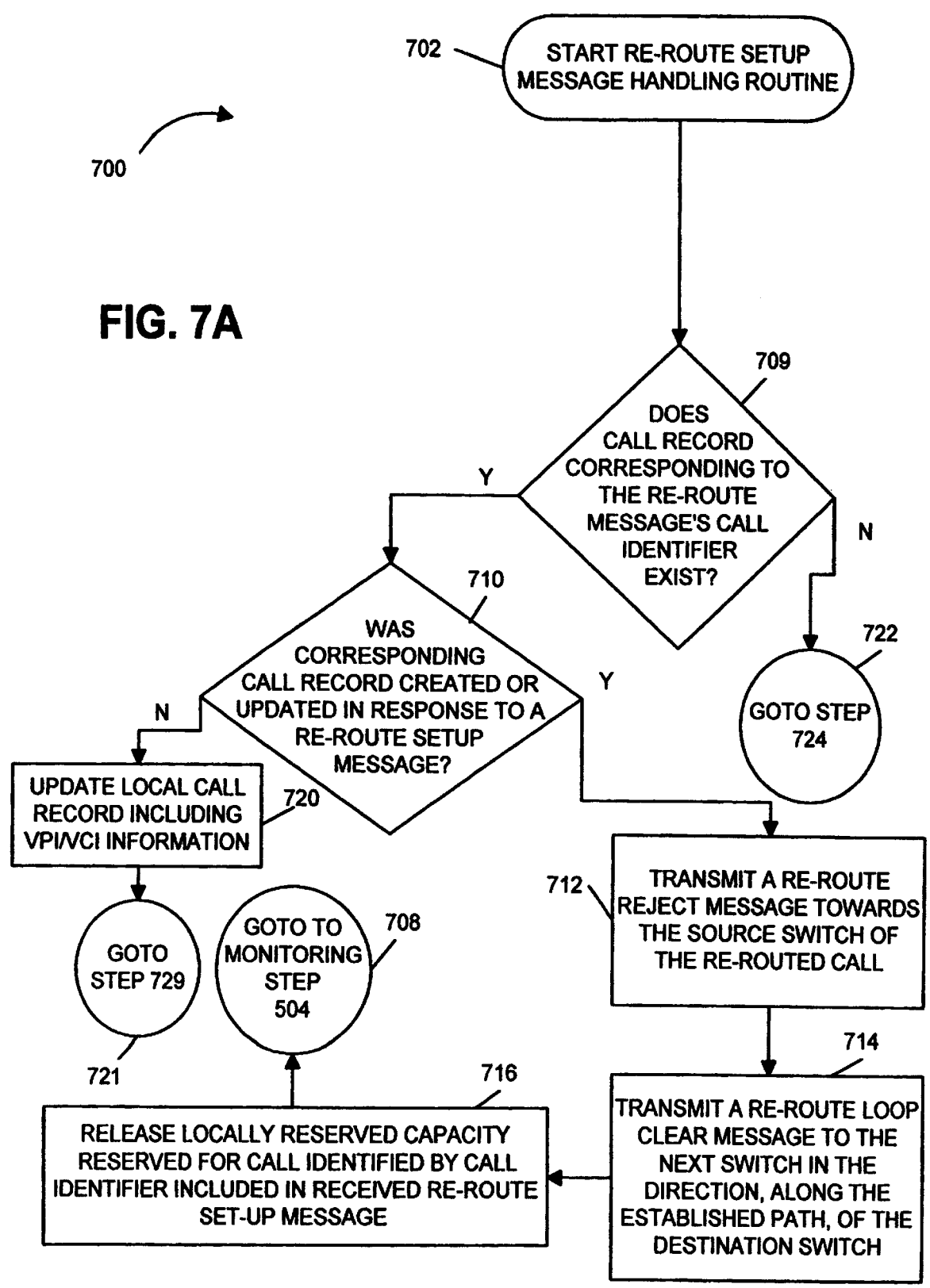
FIG. 7, which comprises the combination of FIGS. 7A and 7B, illustrates a re-route setup message handling routine implemented in accordance with one embodiment of the present invention.
Figure 7B:
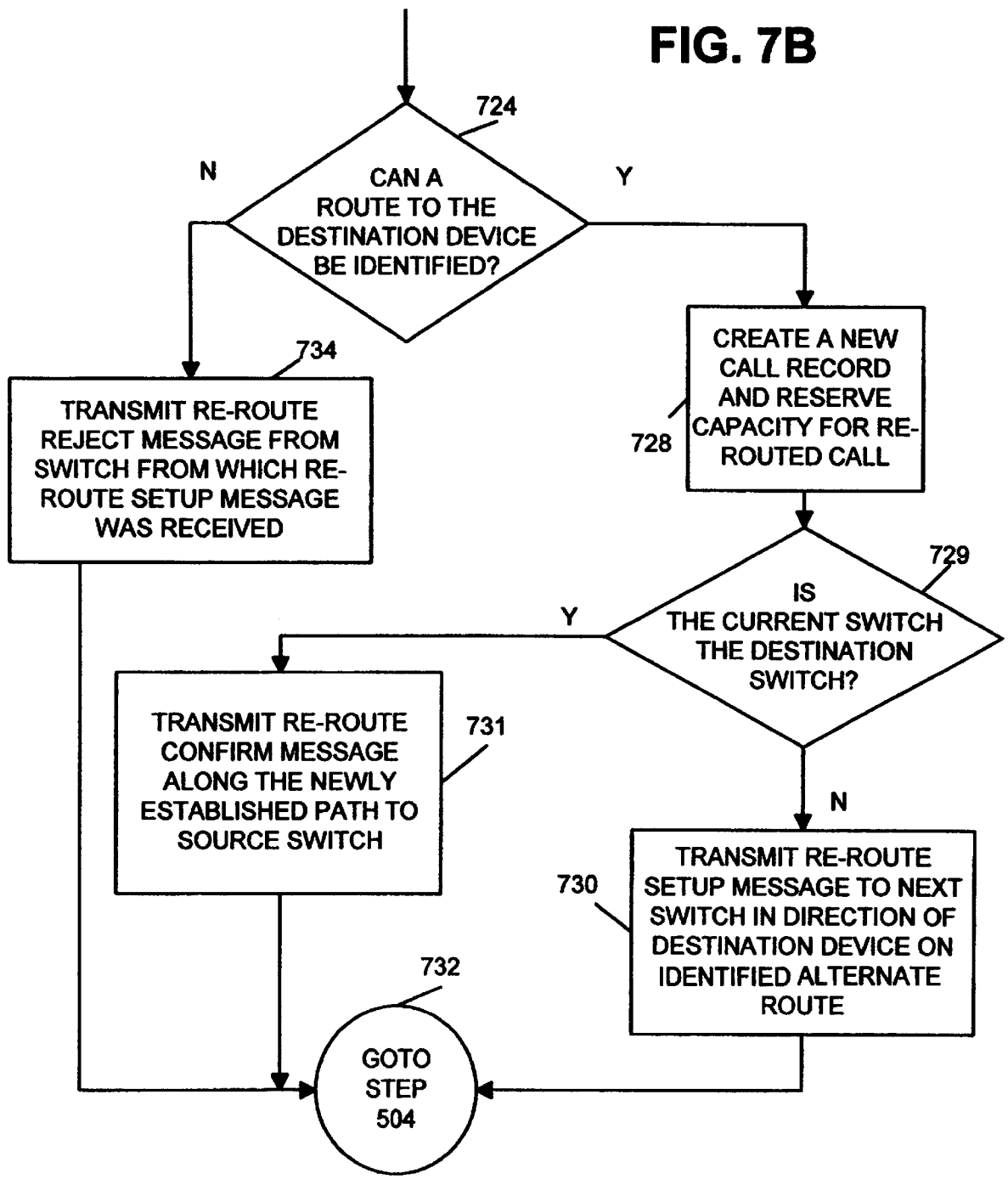

If in step 504, a re-route setup message is received operation progress to the start 702 of the re-route setup message handling routine illustrated in FIGS. 7A and 7B, via step 510.

The response to a re-route setup message performed in accordance with the present invention is summarized below, followed by a detailed description of the exemplary re-route setup message handling routine 700.

At each switch, when a re-route setup message is received, the call identifier corresponding to an affected call is extracted, and the following actions will take place:

1. If the corresponding call record exists at the switch and was not created after receiving a re-route setup message corresponding to the same failure event, e.g., if the node is part of the old route for the connection being re-route, the switch updates its call record locally including the VPI/VCI table 206 and the re-route status, and sends a re-route confirm message along the newly established path back to the source switch if the current switch is the destination switch of the re-routed call. If the current switch is not the destination switch of the re-routed call, the re-route setup message is forwarded to the next switch toward the destination switch from the call record.

2. If the corresponding call record exists at the switch and was created after receiving a re-route setup message, it is likely that a routing loop exists, and the switch:

sends a re-route reject message back to the source switch and a re-route loop clear message toward the destination switch, respectively, to cause the release of the connection and the associated network resources corresponding to the affected call, e.g., bandwidth, the VPI/VCI value, and the corresponding call record stored at the switches; and locally releases the connection and the associated network resources corresponding to the affected call.

3. If the corresponding call record does not exist, a route to the destination can be identified, and the resource allocation routine accepts the re-route request (e.g., there is enough capacity to accommodate the affected call), the switch creates a new record for the affected call and forwards the reroute setup message on the selected alternative route to the next ATM switch if the current switch is not the destination switch of the re-routed call. If the current switch is the destination switch of the re-routed call, the switch sends a re-route confirm message back to the source switch along the newly established route.

4. If the corresponding call record does not exist and a route to the destination can be identified but the switch's connection admission control procedure cannot accept the re-route request, e.g., due to a lack of bandwidth, the switch sends a re-route reject message along the newly established path back to the source switch to release the connection and the associated network resources, e.g., the bandwidth, the VPI/VCI values, and the corresponding call record stored at the switch.

The re-route setup message handling routine 700 will now be described in detail. The routine 700 begins with the start step 702 wherein various initialization operations associated with the routine are performed, e.g., a portion of the routine 700 stored in memory is accessed by the switch's CPU.

Operation progresses from the start step 702 to step 709 where a determination is made as to whether a call record corresponding to the call identifier included in the re-route setup message already exists within the switch's call record database 212. If such a record exists, it indicates that the switch was part of the original call path that was interrupted due to a fault and that the switch has already reserved capacity for handling the call being re-routed.

If, in step 709, it is determined that a call record for the call being re-routed already exists in the switch, operation progresses to step 710. In step 710 a determination is made as to whether the existing call record was created or updated in response to a previously received re-route setup message corresponding to the same failure event. In one embodiment of the present invention, a call record information field is maintained in each call record which is used to indicate if the call record was created or updated in response to a previous re-route message. This call record information field may include a re-route count and the identifier of the switch(es) which generated the received setup message(s). In one embodiment, the call record information field is created/updated each time a call record is created or updated in response to a setup message.

If in step 710, it is determined that the exiting call record corresponding to the call being re-routed was not created or updated in response to a previous re-route setup message corresponding to the same failure event, operation progresses to step 720. In step 720, the local call record is updated to reflect the re-routing of the call. This includes replacing the existing VPI/VCI information in the exiting call record with new VPI/VCI information (which may be the same as that already stored in the call record) generated in response to the re-route setup message and updating the call record to indicate that the record was updated or created in response to a re-route request. From step 720 operation progresses to step 729 via step 721. In step 729 a determination is made as to whether the current switch is the destination switch for the call being re-routed. If the current switch is the destination switch, a re-route confirm message is generated and transmitted, in step 731, back to the source switch along the newly established communication path. From step 731 operation proceeds, via step 732, to monitoring step 504.

If, in step 729 it is determined that the current switch is not the destination switch of the re-routed call, in step 730 the re-route setup message is forwarded to the next switch in the direction of the destination switch. Switch operation the n proceeds once again to the monitoring step 504 via step 732.

If in step 710 it is determined that the existing call record was created or updated in response to a previous re-route setup message corresponding to the same failure event operation progresses to step 712. The existence of a call record which was previously created or up-dated in response to a re-route setup message corresponding to the same failure event suggests that the current re-route setup message is probably part of a routing loop.

In response to detecting conditions indicative of a routing loop, in step 712 a re-route reject message is transmitted to the source of the re-routed call. Operation then proceeds to step 714 wherein a re-route loop clear message, including the call identifier obtained from the re-route setup message, is transmitted to the next switch in the direction along the established path toward the destination switch. As discussed below in regard to the re-route loop clear message handling routine illustrated in FIG. 9, this will cause the downstream switches to release capacity reserved for the call which was being re-routed.

After transmission of the re-route loop clear message in step 714, in step 716 the switch releases the locally reserved capacity for the call identified by the call identifier included in the re-route setup message. This includes releasing the assigned VPI/VCI values, call record, etc. reserved at the switch.

From step 716 operation returns to the monitoring step 504 via step 708.

In step 709, if it is determined that a call record corresponding to the call identifier included in the re-route setup message does not exist, operation proceeds to step 724 via step 722. In step 724 a determination is made as to whether the switch can identify a route to the destination device and if the switch has enough local capacity to handle the re-routed call.

If no route to the destination device can be identified by the switch in step 724, operation progresses to step 734. In step 734, a re-route reject message is transmitted to the switch from which the re-route setup message was received. From step 734 operation progresses to the monitoring step 504, via step 732.

If in step 724 a route to the destination device is identified, operation progresses to step 728 wherein a new call record is generated, VPI/VCI values assigned and capacity is reserved at the switch for the call which is being re-routed. These operations are the same as or similar to those performed when a call is accepted in response to a regular set-up message when a call connection is being initiated as opposed to being re-routed. In step 728, the information carried in the re-route setup message will be recorded in the generated call record to indicate that the call record was created or updated in response to a re-route setup message as opposed to an initial setup message. The information in the re-route setup message may be the same as or similar to that included in a conventional setup message. However, in a re-route setup message one or more bits are used to identify the message as a re-route as opposed to original call setup message.

If in step 729 it is determined that the current switch is not the destination switch, operation progresses to step 730 wherein a re-route setup message is transmitted to the next switch in the direction of the destination device on the identified path in an attempt to complete the re-routing operation. From step 730 operation proceeds once again to monitoring step 504 via step 732. If the current switch is the destination switch of the re-routed call, a re-route confirm message is generated and transmitted, in step 731, back to the source switch along the newly established route. From step 731 operation proceeds once again to monitoring step 504 via step 732.

If, in step 504, a switch detects a re-route reject message, operation progresses to the start 802 of the re-route reject message handling routine 800 via step 512.

Generally, the steps taken at each switch in response to the receipt of a re-route reject message can be described as follows:

the switch extracts the call identifier from the re-route reject message;

if a call record exists corresponding to the extracted call identifier, the switch locally releases the connection and the associated network resources associated with the identified call and then forwards the re-route reject message back to the source switch for the identified call; and if a call record corresponding to the extracted call identifier does not exist, the re-route reject message is destroyed.

Figure 8:
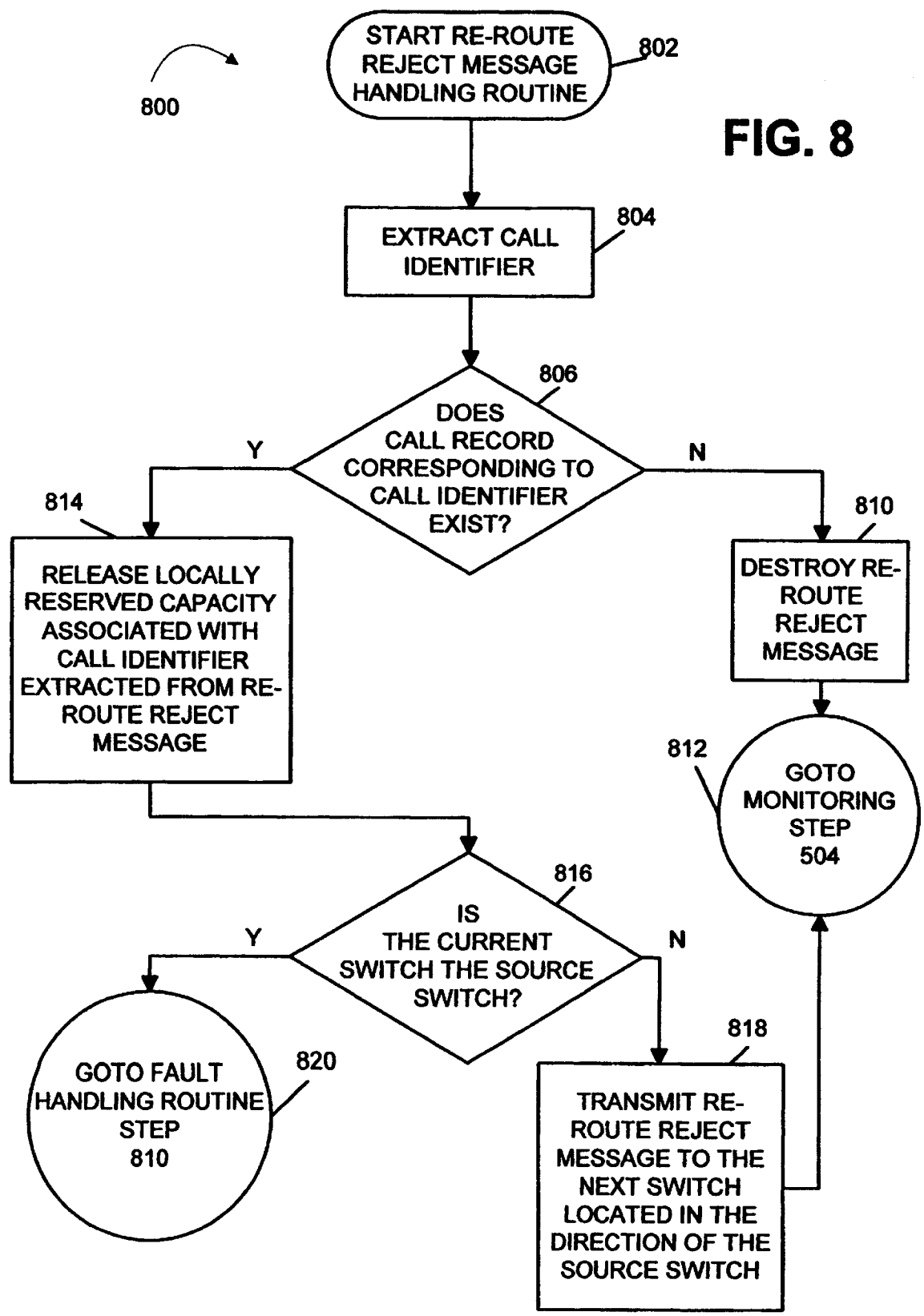
FIG. 8 illustrates a re-route reject message handling routine implemented in accordance with the present invention.
Figure 9:
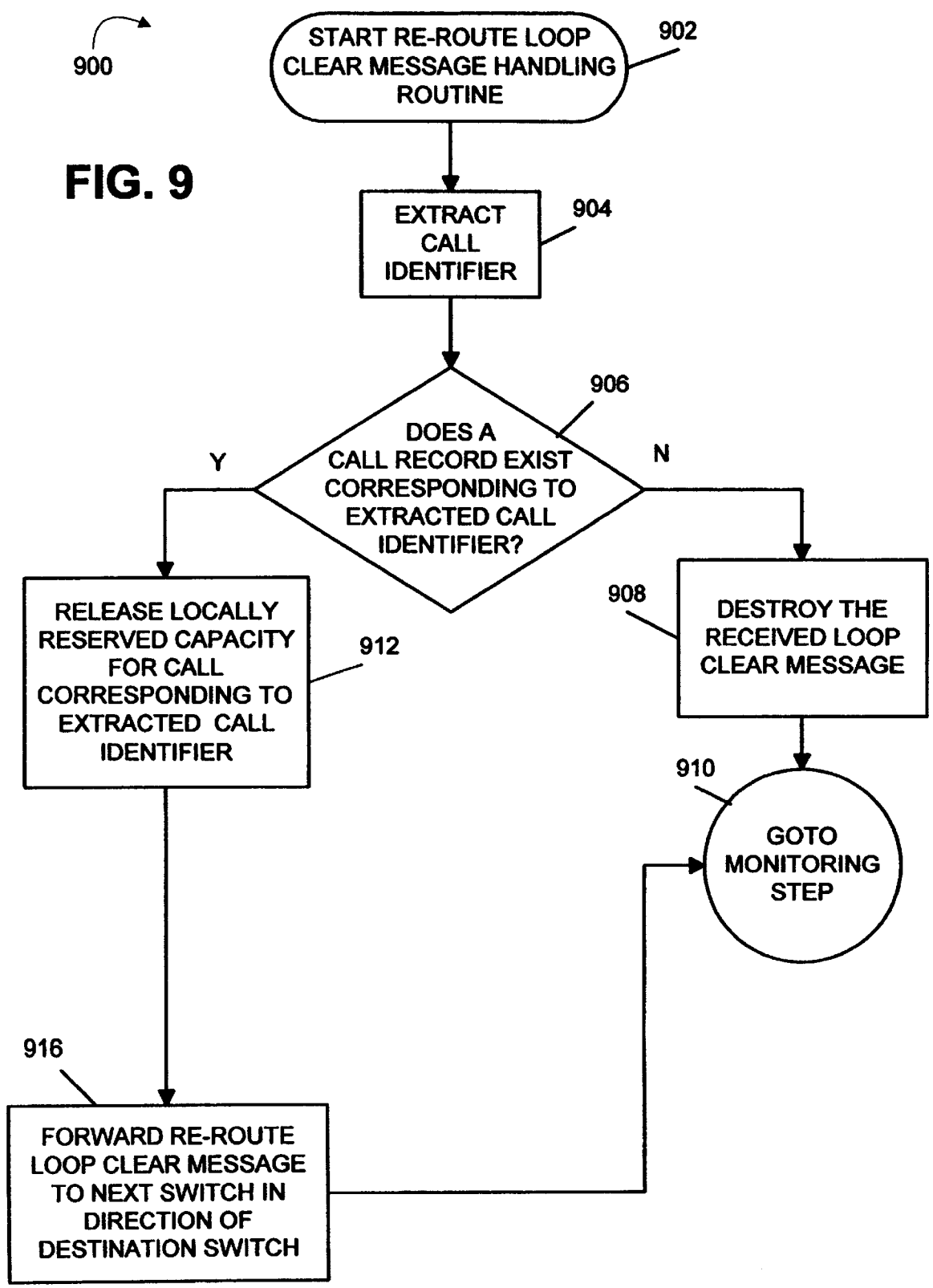
FIG. 9 illustrates a re-route loop clear message handling routine implemented in accordance with the present invention.

The re-route reject message handling routine 800 will now be described in detail with reference to FIG. 8. In the start step 802 various routine initialization operations are performed, e.g., portions of the routine 800 are accessed by the switch's CPU. In step 804, the call identifier is extracted from the received re-route reject message. Using the extracted call identifier, in step 806, a determination is made as to whether or not a call record corresponding to the extracted call identifier exists in the switch's call record database 212. If no call record corresponding to the extracted call identifier is found in the database 212, operation progresses to step 810 wherein the received re-route reject message is destroyed, e.g., discarded and not used further. From step 810 operation returns to the monitoring step 504 via step 812.

If in step 806 it is determined that a call record corresponding to the extracted call identifier exists in the switch's call record database 212, operation progresses to step 814. In step 814 the capacity reserved for handling the call identified by the extracted call identifier is released, e.g., VPI/VCI values are released as well as the corresponding record in the call record database allowing another entry to be stored in the database. Operation then proceeds to step 816 wherein a determination is made as to whether the current switch which received the re-route reject message is the source switch associated with the call identified in the re-route reject message.

If, in step 816, it is determined that the switch is the source switch operation proceeds, via step 820, to step 810 wherein the received re-route reject message is destroyed, e.g., discarded and not used further.

If in step 816 it is determined that the current switch is not the source switch for the call identified by the extracted call identifier, operation progresses to step 818. In step 818, the switch transmits a re-route reject message including the extracted call identifier to the next switch, identified in the call record database as part of the stored path information, toward the source switch of the re-route call. Operation proceeds from step 818, via step 812, to the monitoring step 504.

If in step 504, a re-route loop clear message is received, operation proceeds via step 514 to the start 902 of the re-route loop clear message handling routine 900.

Generally, at each switch when a re-route loop clear message is received, the call identifier corresponding to the call affected by the detected failure will be extracted and the following actions will be performed by the switch:

if a call record corresponding to the extracted call identifier exists at the switch, the switch will locally release the connection and the associated network resources reserved at the switch for the affected call and then forward the re-route loop clear message toward the destination switch; and if a call record corresponding to the extracted call identifier does not exist, the switch will destroy the received message.

The exemplary re-route reject message handling routine 900 will now be described in detail. In the start step 902 various routine initialization operations are performed. Operation then proceeds to step 904 wherein the call identifier corresponding to the call affected by the detected fault is extracted from the re-route loop clear message.

Using the extracted call identifier, a determination is made in step 906 as to whether or not a call record corresponding to the extracted identifier exists in the switch's call record database 212. If a call record exists in the database 212, operation progresses to step 912 wherein the capacity reserved for, and the corresponding call record for handling the call identified by the extracted call identifier, are released. Operation then progresses to step 916.

In step 916, the re-route loop clear message is transmitted to the next switch toward the direction of the destination switch based on the path information stored in the call record of the affected call. Operation then returns to monitoring step 504 via step 910.

If, in step 906, it is determined that no call record corresponding to the extracted call identifier exists in the switch's call record database 212, it indicates that no capacity is reserved in the switch for processing the call identified in the loop-clear message. In such a case, in step 908, the re-route loop clear message is destroyed, e.g., discarded and not used further. Operation then proceeds once again to monitoring step 504 via step 910.

If in step 504, a re-route confirm message is received, operation progresses to step 516 wherein the call record corresponding to the call identifier included in the message is updated to indicate the successful completion of the re-route setup operation by the current switch. If on step 517 the current switch is the source switch of the re-routed call, the re-route confirm message is destroyed in step 519 and not used further.

If the current switch is not the source switch, in step 520 the re-route confirm message is transmitted to the next switch toward the source according to the path information stored in the call record. Operation then returns from either step 519 or step 520 to the monitoring step 504. Once a re-route confirm message is received, in accordance with one embodiment of the present invention, the original connection path for the re-routed call will not be used for the remaining duration of the call even if the detected link or node failure is corrected.

Figure 10:
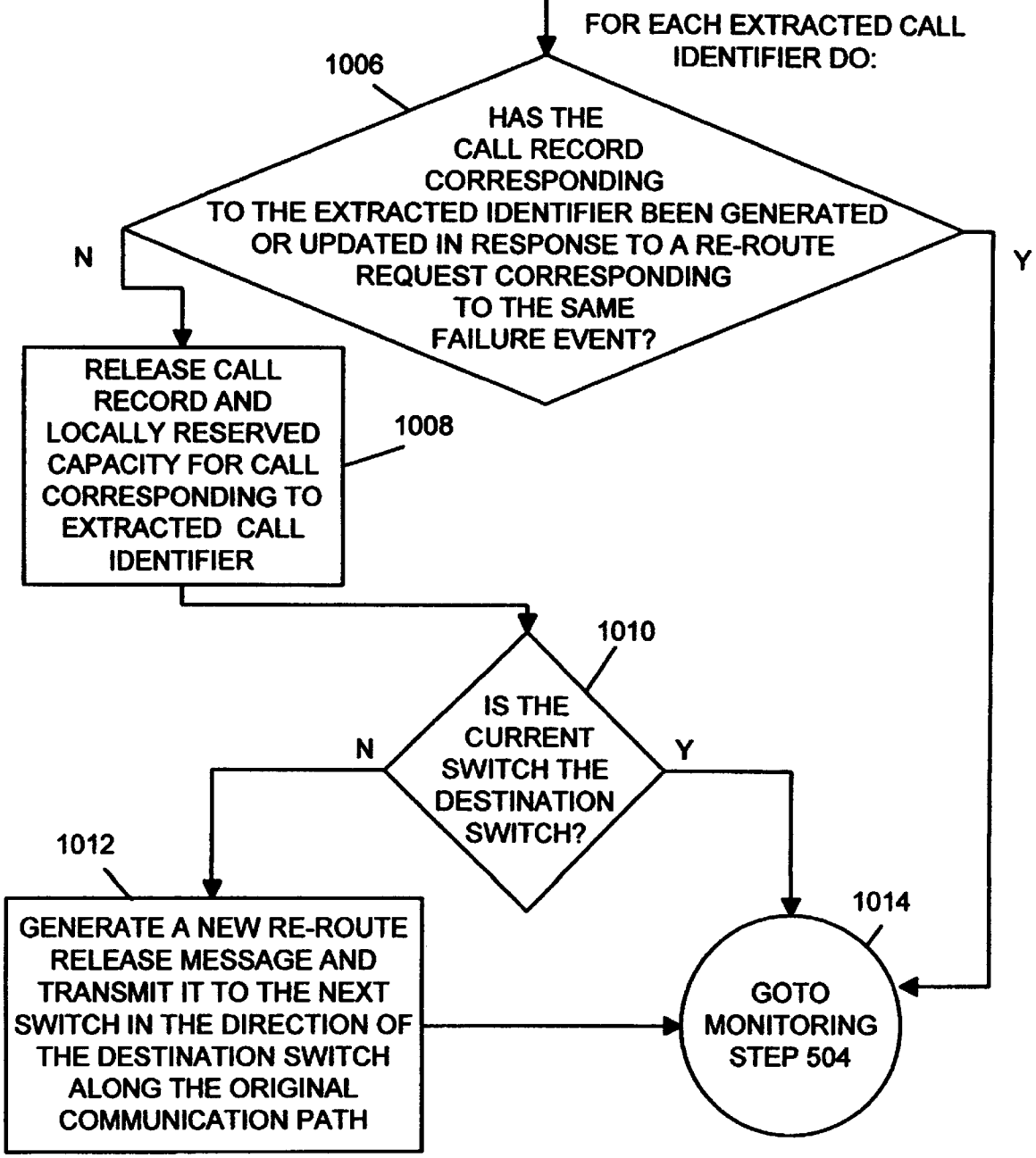
FIG. 10 illustrates a re-route release message handling routine implemented in accordance with one embodiment of the present invention.

In step 504, if a re-route release message is received by a switch, switch operation will progress to the re-route release message handling routine 1000 illustrated in FIG. 10 via step 518.

In response to a re-route release message the switch will extract the call identifier(s) included in the re-route release message. These identifier(s) correspond to calls affected by a detected fault. For each call identifier extracted from the received resource release message, the switch will take the following actions:

1. If a call record included in the switch corresponding to an extracted call identifier has not been generated or updated in response to a re-route setup message corresponding to the same failure event, the switch will release the network resources, e.g., the bandwidth, the VPI/VCI values, and the corresponding call record stored at the switch, reserved for the call identified by the extracted call identifier; and 2. If the current node is not the destination switch, the switch will generate a new re-route release message and forward it toward the corresponding destination switch along the original communication path corresponding to the extracted call identifier. If multiple call identifiers are extracted from one re-route release message, one re-route release message is sent for the affected connection which use the same output link at the switch to reach their destination switches.

One exemplary embodiment of a re-route capacity release message handling routine 1000 will now be described in detail with reference to FIG. 10. The re-route release message handling routine begins in step 1002 wherein various routine initialization operations are performed. In step 1004, the call identifiers included in a re-route release message are extracted. Each extracted call identifier is then processed by the remaining portion of the routine 1000.

In step 1006, a determination is made as to whether a call record stored in the switch's database 212 and corresponding to the extracted call identifier being processed was generated or updated in response to a re-route setup message corresponding to the same failure event. If it was, operation proceeds directly to monitoring step 504 via step 1014. However, if the corresponding call record was not generated or updated in response to a re-route setup message corresponding to the same failure event, indicating it corresponds to an out-dated call record, operation proceeds to step 1008 wherein the call record is released, i.e., deleted from the call record database, and the capacity reserved for the call identified by the extracted identifier is also released.

Operation proceeds from step 1008 to step 1010. In step 1010 a determination is made as to whether or not the current switch is the destination switch. If the current switch is the destination switch, operation proceeds from step 1010 to monitoring step 504 via step 1014.

If in step 1010 it is determined that the current switch is not the destination switch, operation progresses to step 1012 wherein a new re-route release message is generated and transmitted to the next switch on the original path in the direction of the destination switch. As discussed above, in some embodiments, a single release message including the call identifiers of multiple affected switches is used instead of a plurality of individual messages.

Referring now to FIG. 11, a connection used for communicating between source device 102 and destination device 104 of the ATM network 100 is illustrated using solid arrows to represent the established communication path. As illustrated, the established path involves using switches 110, 118, 116, 122 to route packets between the source and destination devices.

Figure 12:
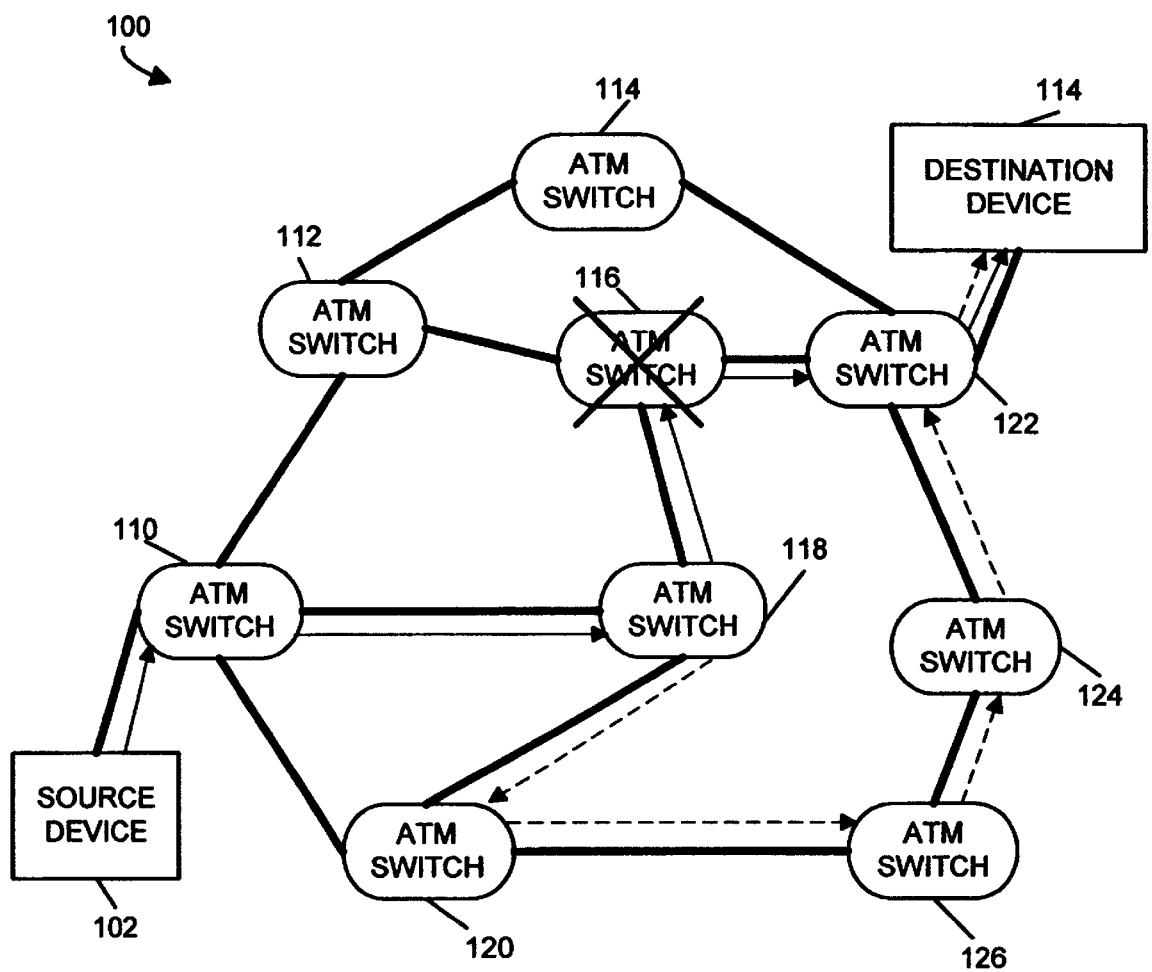
FIG. 12 illustrates re-routing of a virtual connection in response to a switch (node) failure in accordance with a pre-planed hop by hop routing embodiment of the present invention.

FIG. 12 illustrates the ATM network 100 wherein node 116 has failed. In FIG. 12, it is assumed that a pre-planed hop-by-hop routing scheme is used. In FIG. 12, the dashed lines are used to represent the path resulting from re-routing the established connection away from the failed node. Note that the re-routing process is initiated by neighboring upstream node 118 using, e.g., the alternative path information stored in its routing table which is illustrated in FIG. 3B. In the FIG. 12 example, the neighboring downstream node to the failed node is the destination switch 122. Accordingly, in the FIG. 12 example, no re-route release messages need to be transmitted since there are no switches downstream of the downstream neighboring node 122.

The above detailed description has focused primarily on the method of the present invention which is intended to be used in conjunction with pre-planned hop-by-hop routing embodiments. However, as discussed briefly above, the present invention is also directed to restoration methods suitable for use with ATM networks which use pre-planned source routing or dynamic source routing.

Figure 13:
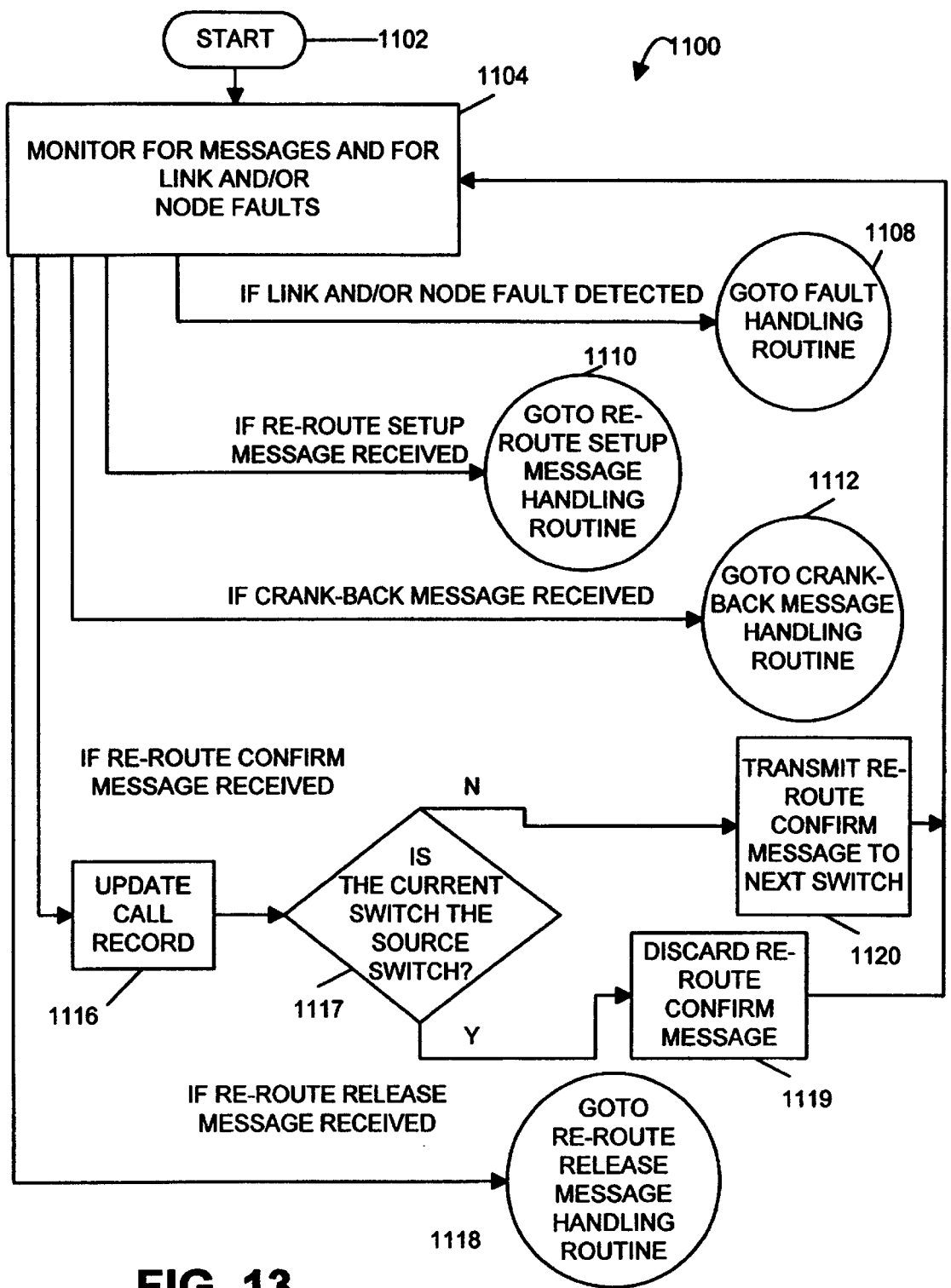
FIG. 13 is a flow chart illustrating a method of the present invention suitable for use with pre-planned source routing.

The source routing embodiments of the present invention will now be discussed in detail with reference to FIGS. 13–15. FIG. 13 illustrates the method 1100 of the present invention performed by each switch in the ATM network 100 in a source (pre-planned or dynamic) routing embodiment after the initial connection is established. As illustrated, the method 1100 begins with the start step 1102 wherein various initialization operations, e.g., the accessing of the routine 1100 stored in memory by the CPU, occur.

Operation progresses to the monitoring step 1104 wherein the switch monitors for messages and for link and/or node faults.

Figure 14:
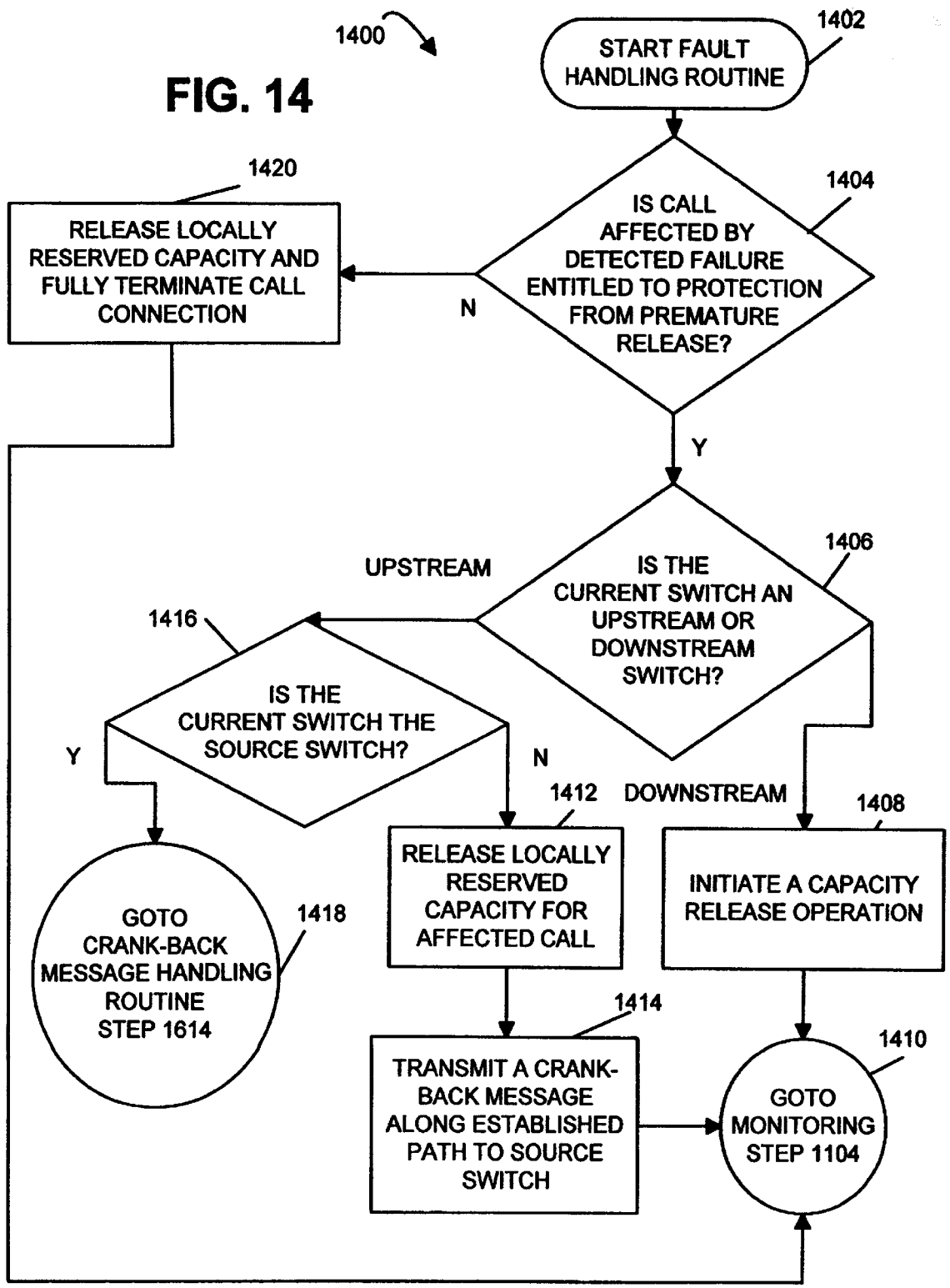
FIG. 14 illustrates a fault handling routine suitable for use in conjunction with the method illustrated in the FIG. 13 flow chart.
Figure 15:
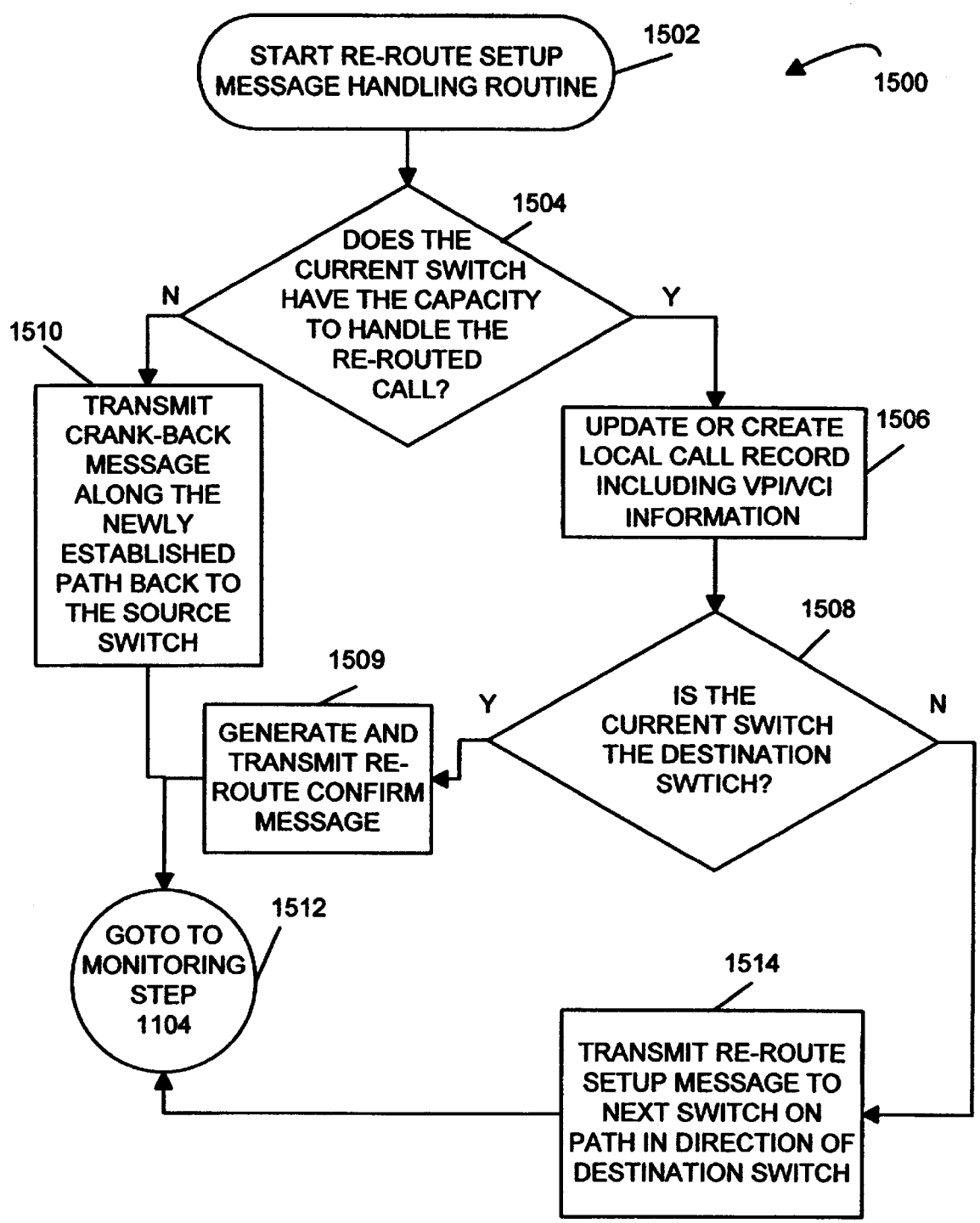
FIG. 15 illustrates a re-route setup message handling routine implemented in accordance with the present invention.

If in step 1104 a link and/or node fault is detected, operation proceeds via step 1108 to the start step 1402 of the fault handling routine 1440 illustrated in FIG. 14. From step 1402 wherein various initialization operations are performed, operation proceeds to step 1404. In step 1404 a determination is made as to whether the call affected by the detected failure is entitled to protection from premature release. If the affected call is not entitled to protection from premature release, in step 1420 the switch releases, e.g., deletes from memory, the local call record and the locally reserved capacity for handling the affected call. After this, the switch takes the steps, necessary to fully terminate the affected call, e.g., the switch transmits a conventional capacity release message. From step 1420 operation returns to step 1104 via step 1410.

While not shown in FIG. 13, if in step 1104 a conventional (as opposed to re-route) capacity release message is received, the switch releases the call record and the capacity reserved for the call identified by a call identifier included in the capacity release message and then returns to the monitoring step 1104.

If in step 1404 it is determined that the call affected by the detected failure is entitled to protection from premature release, operation progresses to step 1406. In step 1406 a determination is made as to whether the switch detecting the failure is an upstream or downstream switch. If the switch detecting the fault is a downstream switch, operation proceeds to step 1408.

In step 1408, the switch initiates a capacity release operation.

It is the responsibility of the neighboring downstream switch to activate the process of releasing network resources reserved for processing the connection or connections affected by the detected fault. In order to do this, in step 1408, the neighboring downstream switch detecting a fault releases the capacity which is reserved locally for handling of affected calls, and transmits resource release messages, i.e., re-route release messages, along the original path of the affected connections toward the affected call's respective destination switches. Each transmitted re-route release message will include one or more call identifiers identifying calls affected by a detected fault and the current re-route count and route originating switch identifier stored in the switch's call record database for the affected calls.

From step 1408 switch operation returns to monitoring step 1104 via step 1410.

If, in step 1406, it is determined that the switch detecting the fault is an upstream node, indicating that the current switch is an upstream neighboring node, operation proceeds to step 1416.

In accordance with the source routing embodiments of the present invention it is the neighboring up-stream switch to the failed link or node which is responsible for initiating the connection restoration process by sending messages back to the source switches of connections affected by the fault. When a neighboring upstream switch initiates the connection restoration process, the call record stored and the capacity reserved at the switch for processing the affected calls is released.

As discussed above, if it is an upstream switch which detects a fault, operation will progress to step 1416. In step 1416 a determination is made as to whether the current switch is the source switch for the affected connection. If it is the source switch, there is no need to generate a crank-back message and operation proceeds, via step 1418, to step 1614 of the crank-back message handling routine.

If, however, it is determined in step 1416, that the current switch is not the source switch operation proceeds to step 1412. In step 1412, the call record stored and the capacity reserved for handling the affected call or calls are released. After the release of the locally reserved capacity for the affected call(s), in step 1414 a crank-back message is generated and transmitted back along the established route toward the source switch of the affected call. Operation then proceeds from step 1414 to the monitoring step 1104 via step 1410.

In step 1104, if a re-route setup message is received operation will proceed to the start 1502 of the re-route setup message handling routine 1500 via step 1110.

After receiving a re-route setup message at a switch, the following actions will take place:

1. If the re-route setup request can be accepted and the corresponding call record exists at the switch, e.g., if the current node is part of the old route for the connection, the local call record is updated to reflect the new route used and the re-route setup message is transmitted toward it s destination. In accordance with the present invention the re-routed call is not switched back to the original route used for the remaining duration of the call after the recovery of the original route if an alternative route is established.

2. If the re-route setup request can be accepted and the corresponding call record does not exist, the local call record is created and the re-route setup message is transmitted towards its destination if the current switch is not the destination switch of the re-route call. If the current switch is the destination switch of the re-routed call, a re-route confirm message is generated and transmitted toward the source switch of the re-routed call.

3. If the re-route setup request cannot be accepted, due to the lack of bandwidth for instance, a crank-back message is generated and sent along the newly established path back to the source switch.

In the start step 1502 of the re-route setup message handling routine various routine initialization operations are performed. Operation proceeds from step 1502, to step 1504, wherein a determination is made, e.g., using the switch's resource allocation routine 218, as to whether the switch has the capacity required to handle the re-routed call.

If the switch does not have the capacity to handle the call being re-routed operation proceeds to step 1510 and the switch generates a crank-back message along the newly established path back to the source switch. After transmission of the crank-back message operation proceeds to step 1104 via step 1512.

If in step 1504 it is determined that the switch has the capacity to handle the call being re-routed, operation proceeds to step 1506 wherein a call record corresponding to the call being re-routed is updated or created if one does not already exist.

From step 1506, operation proceeds to step 1508 wherein a determination is made as to whether the current switch is the destination switch for the call that is being re-routed. If the switch is the destination switch operation proceeds to step 1509. In step 1509, a re-route confirm message is generated and transmitted back to the source switch along the newly established route. Operation then proceeds to monitoring step 1104, via step 1512. If however, the current switch is not the destination switch, operation proceeds from step 1508 to step 1514.

The re-route setup message, like a conventional setup message in a source routing embodiment includes path information. In step 1514, the re-route setup message is transmitted to the next switch based on the routing information included in the re-route setup message toward the destination switch. After transmission of the setup message operation proceeds to the monitoring step 1104 via step 1512.

In step 1104, if a crank-back message is received, operation proceeds to the start of the crank-back message handling routine via step 1112.

At each switch, when a crank-back message is received, for each call identifier extracted from the received crank-back message, the following actions are performed:

1. If the current switch is not the source switch for the call identified by the extracted call identifier, a new crank-back message is generated and forwarded, along the original path, toward the source switch corresponding to the affected call identified by the extracted call identifier. If multiple call identifiers are extracted from one crank-back message, in one embodiment, one crank-back message will be sent for those affected connections using the same outgoing link at the current switch to reach the source switches corresponding to the extracted identifiers; and the switch releases the locally reserved network resources, e.g., bandwidth, VPI/VCI values, and the call record reserved for the affected call corresponding to the extracted call identifier;

2. If the current switch is the source switch for the call identified by the extracted call identifier, the switch will try to find an alternate route to reach the corresponding destination. In the case of a pre-planned source routing embodiment, this can involve the use of alternative routes stored in the switch's routing table. In the case of a dynamic source routing embodiment, this will involve invoking the switch's dynamic routing routines and sending routing messages over the network as is known in the art in an attempt to find an alternative route. If, after a preselected number of attempts to find an alternative route, no route can be found, the call is terminated by transmitting a conventional resource release message.

Figure 16:
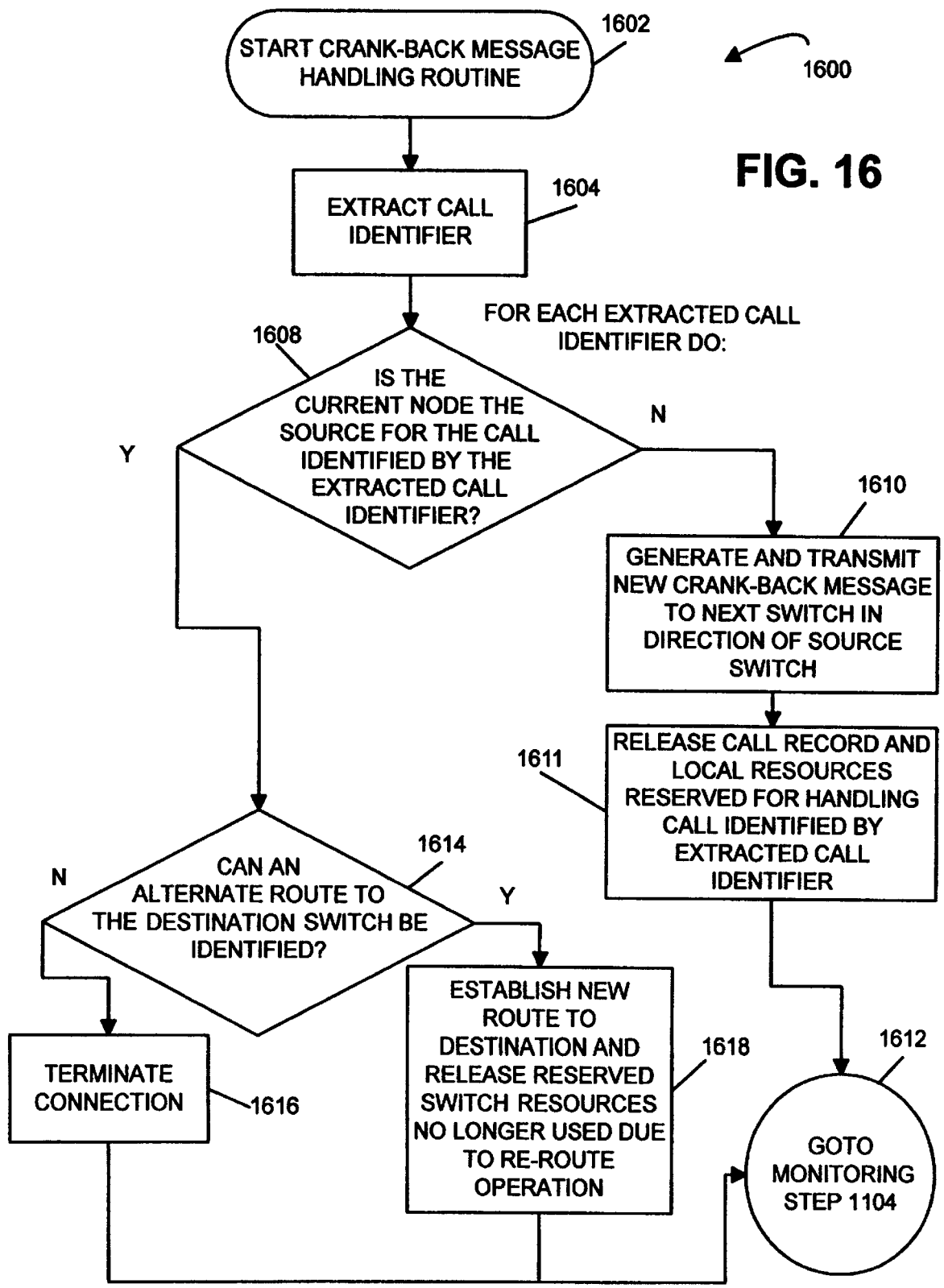
FIG. 16 illustrates a crank-back message handling routine implemented in accordance with the present invention.

The exemplary crank-back message handling routine 1600, which is responsible for controlling a switch's response to a crank-back message will now be discussed in detail with regard to FIG. 16. From start step 1602 where routine initialization operations are performed, e.g., the routine 1600 is accessed by the CPU, operation proceeds to step 1604 where the call identifier(s) included in the received crank-back message are extracted. Each extracted call identifier is then processed starting with step 1608. In step 1608 a determination is made as to whether or not the current node is the source node for the call identified by the extracted call identifier.

If the current node is not the source node for the call identified by the extracted call identifier, operation proceeds to step 1610 wherein a crank-back message is generated and transmitted to the next switch in the direction of the source switch for the call identified by the extracted call identifier. Further, in step 1611 the local call record stored and the resources reserved at the current switch for handling the call identified by the extracted call identifier being processed, are released. From step 1611, switch operation returns to the monitoring step 1104 via step 1612.

If in step 1608 it is determined that the current switch is the source switch for the call identified by the extracted call identifier, operation proceeds to step 1614. In step 1614 the current switch, i.e., the source switch, attempts to find an alternative route to the destination device. In the case of the pre-planned source routing embodiments, this involves selecting from the list of alternative routes stored in the switch's routing table a route which is different from the one that is being used. In accordance with the present invention, information identifying the failed link or node, e.g., the switch with which contact was lost, may be included in the crank-back message. In accordance with a dynamic source routing embodiment, the attempt to find an alternative route to the destination may be impacted by the routing protocol used to update the network state, e.g., the network failure detected. In accordance with the present invention, however, information may be included with the setup messages to distinguish the setup message as part of a re-route operation as opposed to an initial call setup operation. This permits the re-route operation to be identified and, if desired, given routing priority at the switches. In both the pre-planned and dynamic source routing embodiments, the present invention relies to a large extent on the same routing and setup routines used during initial call setup thereby allowing the methods of the present invention to be implemented by making relatively minor changes to existing ATM switches, e.g., to the routines included therein.

If in step 1614 a route to the destination switch can be identified, operation proceeds to step 1618 wherein the new route is established, e.g., by transmitting the necessary set-up message(s). From step 1618 operation returns to the monitoring step 1104 via step 1612.

If in step 1614 a route to the destination switch can not be identified operation proceeds to step 1616 wherein the call is terminated, e.g., by releasing the locally reserved resources and signaling the source device of the connection termination in a conventional manner. From step 1616 operation returns to the monitoring step 1104 via step 1612.

If in step 1104, a re-route confirm message is received, operation progresses to step 1116 wherein the call record corresponding to the call identifier included in the message is updated to indicate the successful completion of the re-route setup operation by the current switch. If in step 1117 the current switch is the source switch of the re-route call, the re-route confirm message is destroyed in step 1119 and not used further.

If the current switch is not the source switch, in step 1120 the re-route confirm message is transmitted to the next switch toward the source according to the path information stored in the call record. Operation then returns from either step 1119 or step 1120 to the monitoring step 1104. Once a re-route confirm message is received, in accordance with one embodiment of the present invention, the original connection path for the re-routed call will not be used for the remaining duration of the call even if the detected link or node failure is corrected.

Processing of re-route release messages is generally the same for the source routing embodiments of the present invention as for the hop-by-hop routing embodiments.

At each switch, when a re-route release message is received, for each call identifier extracted from the received resource release message, the following actions will take place if a call record exists at the switch corresponding to the extracted call identifier ;

1. If the call record corresponding to the extracted identifier has not been created or updated due to a re-route setup message received earlier, corresponding to the same failure event, the switch will release the locally reserved network resources, e.g., the bandwidth, the VPI/VCI values, and the corresponding call record stored at the switch for the call corresponding to the extracted call identifier; and 2. If the current node is not the destination switch, the switch will generate a new re-route release message including the extracted call identifier, the source switch identifier and a re-route count used to keep track of which failure the routing operation is being performed in response to. The switch forwards the generated re-route message towards the corresponding destination switch along the original call path. In one particular embodiment, if multiple call identifier are extracted from one received re-route release message, one re-route release message will be sent for those affected connections using the same outgoing link at the switch to reach their destination switches.

If, in step 1104 a re-route release message is received operation proceeds to the start of a re-route release message handling routine, e.g., step 1002 of routine 1000 illustrated in FIG. 10, via step 1118. In the source routing embodiments of the present invention, at the end of the re-route release message handling routine, i.e., step 1014, operation returns to monitoring step 1104 as opposed to step 504 as in the case of the hop-by-hop routing embodiment.

Figure 17:
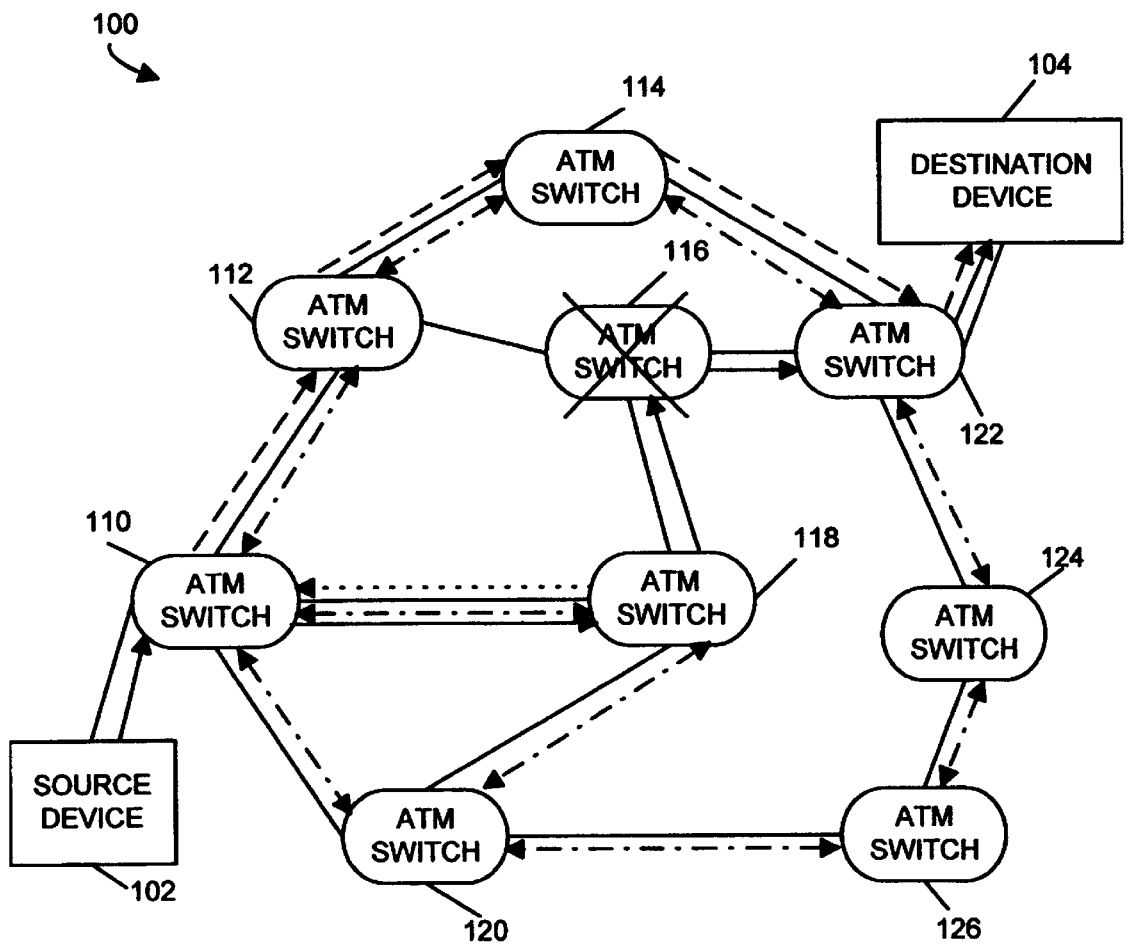
FIG. 17 illustrates rerouting of a connection in response to a switch failure in accordance with a source routing embodiment of the present invention.

FIG. 17 illustrates the re-routing of a call from the source device 102 to the destination device 104, and thus the restoration of the existing connection between source and destination devices, in response to the detection of a node failure by switch 118. In the FIG. 17 illustration, solid lines with an arrow are used to show the original path through the network 100. As illustrated the original path included switches 110, 118, 116, 122. The X across node 116 indicates a node fault or failure. The switch 118, in response to the detection of this fault releases the locally reserved capacity associated with the call(s) affected by the fault and transmits a crank-back message to the source switch 110. In FIG. 17, the crank-back message is represented by the arrow and dotted line extending from switch 118, the neighboring upstream switch, to the source swatch 110.

In response to the crank-back message, the source ATM switch 110 attempts to find an alternative route to the destination switch and destination device. In the pre-planned source routing embodiment, this will involve checking the routing table of switch 110, e.g., the table illustrated in FIG. 3C, for alternative paths. In the dynamic source routing embodiment this will involve initiating a routing operation and transmitting routing update messages throughout the network as is known in the art of dynamic routing paradigm. The bi-directional arrows with dashed/dotted lines between the active nodes (switches) in FIG. 17 represent the routing update messages generated in a dynamic source routing embodiment.

In the FIG. 17 example, the switch 122 is the neighboring downstream switch. Since this switch is also the destination switch no re-route release messages will be generated or transmitted upon detection of the failure of node 116 since there are no additional downstream switches. Assuming that switch 122 has not received a re-route setup message in response to the failure of node 116 prior to detecting the node failure, the switch 122 will release the locally stored call record and reserved capacity for the calls affected by the node failure 116 upon detecting the fault condition.

In FIG. 17, the arrows with dashed lines beginning with the switch 110 and proceeding to the destination switch 122 via switches 112, 114 represent the alternative route to the destination device 104 established in accordance with the source routing embodiments of the present invention in order to restore the connection affected by the failure of switch 116.

While the methods and apparatus of the present invention have been described with reference to an ATM network embodiment, it is to be understood that they are not so limited and may be applied to various types of networks, call routing applications, and in numerous other systems where it is desirable to detect node, link and/or connection failures and to re-establish a failed connection without having to repeat all of the set-up procedures required to initially establish the call.

What is claimed is:

1. A method of operating a switch in a network including a plurality of switches, a source device, and a destination device, the method comprising the steps of:

monitoring to detect a node or link failure affecting a connection in an established communication path between the source and destination devices thereby affecting a call using the established communication path;

operating the switch in response to the detection of a node or link failure, to determine if the switch is on the source or destination device side of the node or link failure;

if it is determined that the switch is on the source side of a detected node or link failure, operating the switch to initiate a re-routing operation, the re-routing operation involving the steps of:

assigning a new virtual connection identifier to the affected call;

accessing alternate route information stored in a routing table included within the switch to identify an alternate route to be used to re-establish the connection with the destination device; and transmitting a re-route set-up message used to re-establish the connection with the destination device.

2. The method of claim 1, wherein the re-route setup message includes a setup message count value, the method further comprising the step of:

generating the setup message count value by incrementing a setup message count value stored in a call record located in the switch.

3. The method of claim 2, wherein the step of monitoring to detect a node or link failure includes the step of:

using ATM assured mode data transport operation on signaling channels connecting the switch to other switches.

4. A method of operating a switch in a network including a plurality of switches, a source device, and a destination device, the method comprising the steps of:

monitoring to detect a node or link failure affecting a connection in an established communication path between the source and destination devices thereby affecting a call using the established communication path;

operating the switch in response to the detection of a node or link failure, to determine if the switch is on the source or destination device side of the node or link failure;

if it is determined that the switch is on the destination side of a detected node or link failure, operating the switch to initiate a limited capacity release operation;

if it is determined that the switch is on the source side of a detected node or link failure, operating the switch to initiate a re-routing operation, the re-routing operation involving the steps of:

assigning a new virtual connection identifier to the affected call;

accessing alternate route information stored in a routing table included within the switch to identify an alternate route to be used to re-establish the connection with the destination device; and transmitting a re-route set-up message used to re-establish the connection with the destination device.

5. The method of claim 4, wherein the step of operating the switch to initiate a limited capacity release operation includes the steps of:

transmitting to a switch located along the original communication path used by the affected call, in the direction of the destination device, a re-route release message.

6. The method of claim 5, wherein the re-route release message includes a call identifier and a setup message count value obtained from a call record, stored in the switch, corresponding to the affected call.

7. The method of claim 5, further comprising the steps of:

operating the switch to monitor for the receipt of a re-route release message including a call identifier; and upon detecting a re-route release message, operating the switch to release the capacity reserved at the switch for processing the call identified by the call identifier included in the re-route release message.

8. The method of claim 7, wherein the step of operating the switch to release the capacity reserved at the switch is only performed if the call record at the switch corresponding to the call identified by the call identifier included in the re-route release message was not already updated in response to a re-route setup message generated as a result of the same failure which resulted in the generation of the re-route release message.

9. A method of operating a switch in a network including a plurality of switches, a source device, and a destination device, the method comprising the steps of:

monitoring to detect a node or link failure affecting a connection in an established communication path between the source and destination devices thereby affecting a call using the established communication path;

operating the switch in response to the detection of a node or link failure, to determine if the switch is on the source or destination device side of the node or link failure;

if it is determined that the switch is on the source side of a detected node or link failure, operating the switch to initiate a re-routing operation, the re-routing operation involving the steps of:

assigning a new virtual connection identifier to the affected call;

accessing alternate route information stored in a routing table included within the switch to identify an alternate route to be used to re-establish the connection with the destination device; and transmitting a re-route set-up message used to re-establish the connection with the destination device; and further, in response to receiving a re-route setup message including a call identifier, operating the switch to perform a resource availability check to determine if sufficient resources are available to service the call identified in the re-route setup message request.

10. The method of claim 9, further comprising the step of:

rejecting a re-route setup request by transmitting a re-route reject message if sufficient resources are not available to service the call identified in the re-route setup request.

11. The method of claim 10, wherein different standards are applied when determining whether to accept setup requests corresponding to calls being initiated as opposed to re-route requests corresponding to calls being re-routed.

12. A method of operating a switch in a network including a plurality of switches, a source device, and a destination device, the method comprising the steps:

monitoring to detect a node or link failure affecting a connection in an established communication path between the source and destination devices thereby affecting a call using the established communication path;

operating the switch in response to the detection of a node or link failure, to determine if the switch is on the source or destination device side of the node or link failure;

if it is determined that the switch is on the source side of a detected node or link failure, operating the switch to initiate a re-routing operation, the re-routing operation involving the steps of:

assigning a new virtual connection identifier to the affected call;

accessing alternate route information stored in a routing table included within the switch to identify an alternate route to be used to re-establish the connection with the destination device; and transmitting a re-route set-up message used to re-establish the connection with the destination device; and further, upon receiving a re-route setup message including a call identifier, performing the following steps:

determining if a call record in the switch corresponding to the call identifier, included in the re-route setup message, was created or updated in response to a previous re-route setup message corresponding to the same failure event; and upon determining that a call record in the switch corresponding to the call identifier, included in the re-route setup message, was created or updated in response to a previous re-route setup message corresponding to the same failure event performing the step of:

transmitting a re-route loop clear message.

13. A method of operating a switch in a network including a plurality of switches, a source device, and a destination device, the method comprising the steps:

monitoring to detect a node or link failure affecting a connection in an established communication path between the source and destination devices thereby affecting a call using the established communication path;

operating the switch in response to the detection of a node or link failure, to determine if the switch is on the source or destination device side of the node or link failure;

if it is determined that the switch is on the source side of a detected node or link failure, operating the switch to initiate a re-routing operation, the re-routing operation involving the steps of:

assigning a new virtual connection identifier to the affected call; and wherein a single communication path is used to service a plurality of different calls corresponding to different applications, and wherein the switch provides calls using the same path different degrees of protection from premature connection release upon detecting a node or link failure affecting the single communication path.

14. A method of operating a switch in a network including a plurality of switches, a source device, and a destination device, the method comprising the steps:

monitoring to detect a node or link failure affecting a connection in an established communication path between the source and destination devices thereby affecting a call using the established communication path;

operating the switch in response to the detection of a node or link failure, to determine if the switch is on the source or destination device side of the node or link failure;

if it is determined that the switch is on the source side of a detected node or link failure, operating the switch to initiate a re-routing operation, the re-routing operation involving the step of:

assigning a new virtual connection identifier to the affected call; and wherein the step of initiating a re-routing operation further includes the steps of:

determining if the switch detecting the failure is a source switch for the affected call;

if it is determined that the switch detecting the failure is the source switch for the affected call, transmitting a re-route setup message; and if it is determined that the switch detecting the failure is not a source switch for the affected call transmitting a crank back message to the source switch for the affected call to cause the source switch to perform a re-route operation.

15. The method of claim 14, further comprising the step of:

detecting the receipt of a crank back message including a call identifier by the switch; and in response to a detected crank back message performing the step of:

releasing the network capacity reserved at the switch for processing the call identified by the call identifier included in the received crank back message.

16. The method of claim 14, wherein the step of monitoring to detect a node or link failure includes the step of:

using ATM assured mode data transport operation on signaling channels connecting the switch to other switches.

17. The method of claim 14, further comprising the step of:

if it is determined that the switch is on the destination side of a detected node or link failure, operating the switch to initiate a limited capacity release operation.

18. The method of claim 17, wherein the step of operating the switch to initiate a limited capacity release operation includes the steps of:

transmitting to a switch located along the original communication path used by the affected call, in the direction of the destination device, a re-route release message.

19. The method of claim 18, further comprising the step of:

operating the switch to monitor for the receipt of a re-route release message including a call identifier; and upon detecting a re-route release message, operating the switch to release the capacity reserved at the switch for processing the call identified by the call identifier included in the re-route release message.

20. The method of claim 19, wherein the step of operating the switch to release the capacity reserved at the switch is only performed if the call record at the switch corresponding to the call identified by the call identifier included in the re-route release message was not already updated in response to a re-route setup message generated as a result of the same failure which resulted in the generation of the re-route release message.

21. The method of claim 14, further comprising the steps of:

in response to receiving a re-route setup message including a call identifier, operating the switch to perform a resource availability check to determine if sufficient resources are available to service the call identified in the re-route setup request.

22. The method of claim 21, further comprising the step of:
   rejecting a re-route setup request by transmitting a re-route reject message if sufficient resources are not available to service the call identified in the re-route setup request.

23. The method of claim 22, wherein different standards are applied when determining whether to accept setup requests corresponding to calls being initiated as opposed to re-route requests corresponding to calls being re-routed.

24. A method of operating a switch in a network including a plurality of switches, a source device, and a destination device, the method comprising the steps:
   monitoring to detect a node or link failure affecting a communication path between the source and destination devices;
   operating the switch in response to the detection of a node or link failure, to determine if the switch is on the source or destination device side of the node or link failure; and
   if it is determined that the switch is on the destination side of a detected node or link failure, operating the switch to initiate a limited capacity release operation to release reserved switch capacity no longer used by the affected communication path.

25. The method of claim 24, wherein the step of operating the switch to initiate a limited capacity release operation includes the step of:
   transmitting a re-route release message along the affected communication path in the direction of the destination device.

26. The method of claim 25, wherein the re-route release message includes a call identifier and a setup message count value obtained from a call record, stored in the switch, corresponding to the affected call.

27. The method of claim 25, wherein the step of operating the switch to initiate a limited capacity release operation further includes the steps of:
   releasing capacity reserved in the switch for processing communications along the affected communication path.

28. The method of claim 27, further comprising the steps of:
   operating the switch to monitor for the receipt of a re-route release message including a call identifier; and
   upon detecting a re-route release message, operating the switch to release the capacity reserved at the switch for processing the call identified by the call identifier included in the re-route release message .

29. The method of claim 28, wherein the step of operating the switch to release the capacity reserved at the switch is only performed if the call record at the switch corresponding to the call identified by the call identifier included in the re-route release message was not already updated in response to a re-route setup message generated as a result of the same failure which resulted in the generation of the re-route release message.

30. A switch for use in a network including a plurality of other switches, a source device, and a destination device, the switch comprising:
   means for monitoring to detect node or link failures affecting a connection in an established communication path;
   means for determining, in response to the detection of a node or link failure, if the switch is on the source or destination device side of the node or link failure;
   means for initiating a re-routing operation when it is determined that the switch is on the source side of a node or link failure, wherein said means for initiating includes:
   means for assigning a new virtual connection identifier to the affected call;
   means for accessing alternate route information stored in a routing table included within the switch to identify an alternate route to be used to re-establish the connection with the destination device; and
   means for transmitting a re-route set-up message used to re-establish the connection with the destination device.

31. A switch for use in a network including a plurality of other switches, a source device, and a destination device, the switch comprising:
   means for detecting a node or link failure affecting a communication path between the source and destination devices;
   means for determining, if the switch is on the source or destination device side of a detected node or link failure; and
   means for initiating a limited capacity release operation to release reserved switch capacity no longer used by the affected communication path.

32. The switch of claim 31,
   wherein the switch includes a memory for storing information relating to calls; and
   wherein the means for initiating a limited capacity release operation includes means for deleting from memory virtual connection identifier information associated with the calls using the affected communication path and for freeing resources reserved for processing calls using the affected communication path.

* * * * *

UNITED STATES PATENT AND TRADEMARK OFFICE
CERTIFICATE OF CORRECTION

| | | |
|---|---|---|
| PATENT NO. | : 6,167,025 | Page 1 of 1 |
| APPLICATION NO. | : 08/926255 | |
| DATED | : December 26, 2000 | |
| INVENTOR(S) | : Deh-phone K. Hsing et al. | |

It is certified that error appears in the above-identified patent and that said Letters Patent is hereby corrected as shown below:

On The Title Page

Item -63- under "RELATED APPLICATIONS":

Delete "is a continuation-in-part of pending" and replace with --claims priority from--.

Signed and Sealed this

Twenty-seventh Day of October, 2009

David J. Kappos
*Director of the United States Patent and Trademark Office*